(12) United States Patent
Lee et al.

(10) Patent No.: US 12,046,614 B2
(45) Date of Patent: Jul. 23, 2024

(54) APPARATUS AND METHODS FOR EFFECTIVE IMPURITY GETTERING

(71) Applicant: Taiwan Semiconductor Manufacturing Co., Ltd., Hsin-Chu (TW)

(72) Inventors: Yueh-Chuan Lee, Hsinchu (TW); Shih-Hsien Huang, Hsin-Chu (TW); Chia-Chan Chen, Zhubei (TW); Pu-Fang Chen, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 16/998,525

(22) Filed: Aug. 20, 2020

(65) Prior Publication Data

US 2022/0059582 A1 Feb. 24, 2022

(51) Int. Cl.
*H01L 27/146* (2006.01)
(52) U.S. Cl.
CPC .... *H01L 27/1463* (2013.01); *H01L 27/14643* (2013.01); *H01L 27/14683* (2013.01); *H01L 27/14698* (2013.01)

(58) Field of Classification Search
CPC ........... H01L 27/1463; H01L 27/14643; H01L 27/14683; H01L 27/14698
See application file for complete search history.

(56) References Cited

U.S. PATENT DOCUMENTS

| | | | |
|---|---|---|---|
| 2006/0006436 A1 | 1/2006 | Mouli | |
| 2013/0234202 A1* | 9/2013 | JangJian | H01L 27/1464 438/94 |
| 2015/0145096 A1* | 5/2015 | Hsu | H01L 27/14689 438/73 |
| 2016/0284757 A1* | 9/2016 | Kaneda | H01L 27/14643 |
| 2017/0278893 A1* | 9/2017 | Cheng | H05K 999/99 |

* cited by examiner

*Primary Examiner* — Aaron J Gray
(74) *Attorney, Agent, or Firm* — Duane Morris LLP

(57) ABSTRACT

Apparatus and methods for effective impurity gettering are described herein. In some embodiments, a described device includes: a substrate; a pixel region disposed in the substrate; an isolation region disposed in the substrate and within a proximity of the pixel region; and a heterogeneous layer on the seed area. The isolation region comprises a seed area including a first semiconductor material. The heterogeneous layer comprises a second semiconductor material that has a lattice constant different from that of the first semiconductor material.

19 Claims, 29 Drawing Sheets

APPARATUS AND METHODS FOR EFFECTIVE IMPURITY GETTERING

BACKGROUND

Semiconductor image sensors typically include complementary metal-oxide-semiconductor (CMOS) image sensors (CIS) and charge-coupled device (CCD) sensors, which are widely used to sense light in various applications such as digital still camera (DSC), mobile phone camera, digital video (DV) and digital video recorder (DVR) applications. For example, image sensors can be used for sensing exposed light projected toward a semiconductor substrate. CMOS image sensors generally include an active region having an array of light sensitive elements (pixels), and a periphery region. These products utilize an array of active pixels (i.e., image sensor elements or cells) including photodiodes and other elements (e.g., transistors) to convert images into digital data or electrical signals.

The photodiodes are characterized by a dark current (DC) or a white pixel (WP) performance. To improve DC and WP performances, defect centers have been generated for impurity gettering. In one example, silicon defects are generated, based on e.g. carbon implantation, as gettering centers close to pixels or photodiodes. But these gettering centers can induce crystal defects and extra leakage in photodiodes nearby, which causes worse DC and WP performances. In another example, a backside poly layer is used as a gettering center to collect metal ions and defects during thermal process. But the backside poly layer is far from the photodiode, e.g. up to hundreds of micrometers. This degrades the gettering capability, as it is difficult or impossible for metal ions in the photodiode to travel that far to the gettering center.

As such, conventional apparatus and methods of impurity gettering have not been entirely satisfactory in every aspect.

BRIEF DESCRIPTION OF THE DRAWINGS

Various exemplary embodiments of the present disclosure are described in detail below with reference to the following Figures. The drawings are provided for purposes of illustration only and merely depict exemplary embodiments of the present disclosure to facilitate the reader's understanding of the present disclosure. Therefore, the drawings should not be considered limiting of the breadth, scope, or applicability of the present disclosure. It should be noted that for clarity and ease of illustration these drawings are not necessarily drawn to scale.

DETAIL DESCRIPTION

Figure 1:
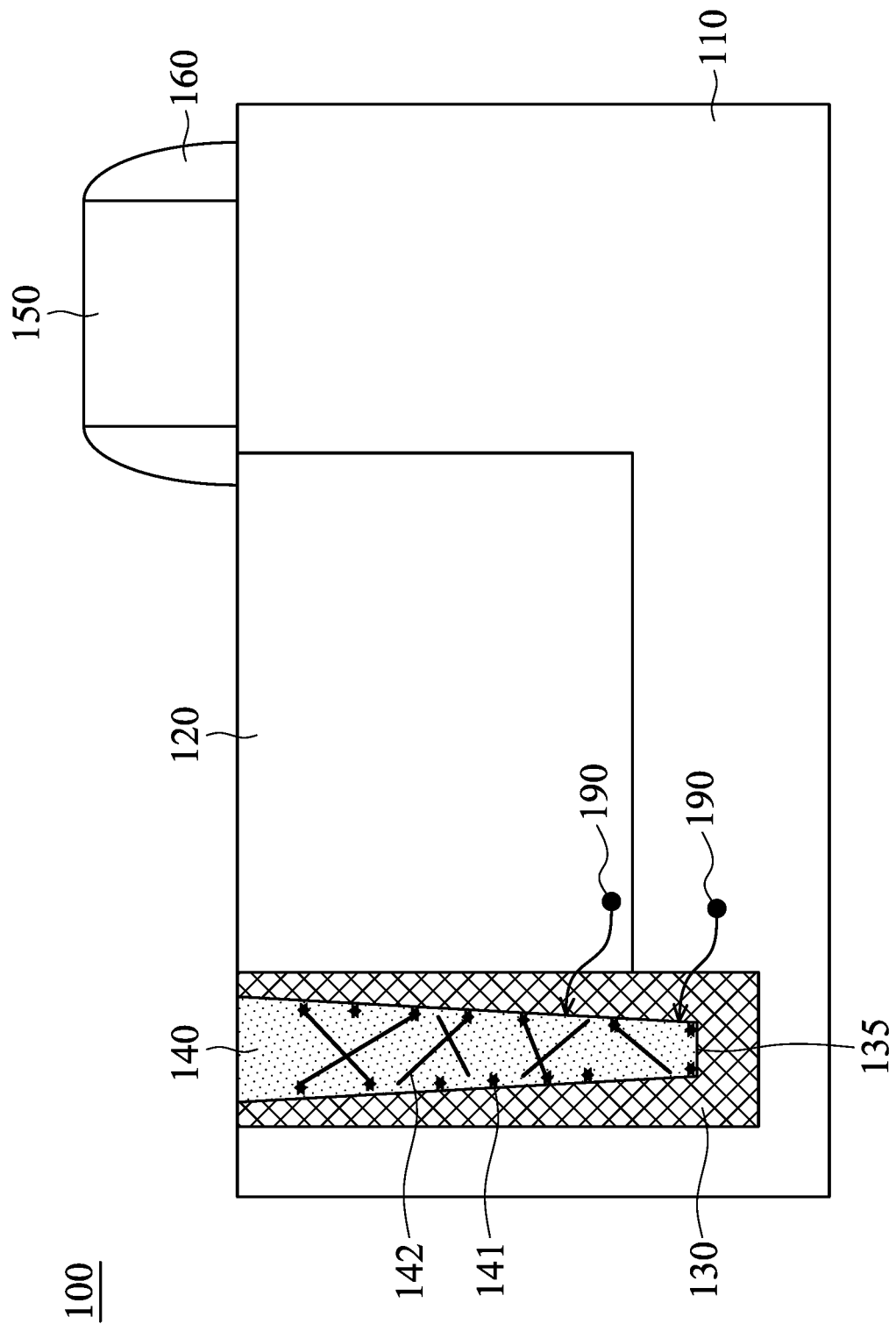
FIG. 1 illustrates a schematic cross-sectional view of a device comprising a pixel cell and a gettering center, in accordance with some embodiments of the present disclosure.

Various exemplary embodiments of the present disclosure are described below with reference to the accompanying figures to enable a person of ordinary skill in the art to make and use the present disclosure. As would be apparent to those of ordinary skill in the art, after reading the present disclosure, various changes or modifications to the examples described herein can be made without departing from the scope of the present disclosure. Thus, the present disclosure is not limited to the exemplary embodiments and applications described and illustrated herein. Additionally, the specific order and/or hierarchy of steps in the methods disclosed herein are merely exemplary approaches. Based upon design preferences, the specific order or hierarchy of steps of the disclosed methods or processes can be re-arranged while remaining within the scope of the present disclosure. Thus, those of ordinary skill in the art will understand that the methods and techniques disclosed herein present various steps or acts in a sample order, and the present disclosure is not limited to the specific order or hierarchy presented unless expressly stated otherwise.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Terms such as "attached," "affixed," "connected" and "interconnected," refer to a relationship wherein structures are secured or attached to one another either directly or indirectly through intervening structures, as well as both movable or rigid attachments or relationships, unless expressly described otherwise.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Reference will now be made in detail to the present embodiments of the disclosure, examples of which are illustrated in the accompanying drawings. Wherever possible, the same reference numbers are used in the drawings and the description to refer to the same or like parts.

The present disclosure provides devices and methods for impurity gettering, where a heterogeneous layer is generated as a gettering center within a proximity of a pixel region in an image sensor, e.g. a complementary metal-oxide-semiconductor (CMOS) image sensor (CIS), to improve dark current (DC) and white pixel (WP) performances of the image sensor. The heterogeneous layer is a sacrificed and non-photo-active region, and has a super defective structure to collect defects, e.g. metal ions, silicon dot-defects, impurities, etc., in the silicon bulk region including the pixel region to form device circuits.

In one embodiment, a disclosed device, e.g. an image sensor, includes a pixel region disposed in a substrate, and a heterogeneous layer including high-density defects near the pixel region. The heterogeneous layer includes a semiconductor material that has a lattice constant different from that of a semiconductor material in the substrate. For example, when the substrate is made of silicon (Si), the heterogeneous layer may include: germanium (Ge), silicon germanium (SiGe), germanium tin (GeSn), indium arsenide (InAs), indium antimonide (InSb), silicon carbide (SiC), silicon borides (SiB), phosphidosilicates (SiP), or any other semiconductor material that has a lattice mismatch with silicon. The lattice mismatch between the two semiconductor materials induces defects such as dislocations or strains generated at the hetero-interfaces and penetrating into the heterogeneous layer. The strains and defects induced by the heterogeneous layer are very effective for gettering metal ions, silicon dot-defects, and impurities of the device after heat treatment, which causes less strains and less defects in the silicon region of the substrate.

In one embodiment, the heterogeneous layer is a highly defective layer serving as a gettering center and is very close to the pixel region, damaged shallow trench isolation (STI) and/or damaged photodiode surface, which are main sources of dark currents and white pixels. As such, the heterogeneous layer near the photodiode can attract more defects from photodiode, to reduce dark currents and white pixels.

At the same time, the generated high-density defects including strains and dislocations are located only within the heterogeneous layer, but not in the silicon region of the substrate. That is, the defects and dislocations originate from the highly defective layer and terminate at the hetero-interfaces, without going outside the highly defective layer or the heterogeneous layer. The defects and dislocations are typically located near the hetero-interfaces and within the heterogeneous layer. Because of this clear and controlled boundary of defects, the heterogeneous layer can be located very close to the photodiode or the photo-active region to achieve a high gettering efficiency. While the generated crystal defects (like strains and dislocations) are confined in the heterogeneous layer to attract impurity, the crystal defects will not extend into the silicon region or pixel region to cause damage in the photodiode. As such, the disclosed device structure can provide an effective impurity gettering without silicon damages in photodiodes, thereby avoiding the leakage side effect.

According to various embodiments, the heterogeneous layer may be disposed in the substrate and near the photo-diode, above the photodiode, or right on the photodiode. According to some embodiments, the device also includes an isolation region, which may be around the heterogeneous layer or under the heterogeneous layer. In one embodiment, the isolation region comprises silicon and a dopant, and is configured for isolating the heterogeneous layer from charge carriers generated in the substrate of the image sensor. The dopant may have a conductivity type being n-type or p-type.

FIG. 1 illustrates a schematic cross-sectional view of a semiconductor device 100 comprising a pixel cell and a gettering center, in accordance with some embodiments of the present disclosure. In some embodiments, the semiconductor device 100 is a CMOS image sensor device, which may be operated for sensing incident light.

As shown in FIG. 1, the semiconductor device 100 includes a substrate 110, a pixel region 120, an isolation region 130, a heterogeneous layer 140, and a transfer gate 150. The substrate 110 may comprise: a group IV material, a group IV material compound, or a group III-V material compound. The pixel region 120 is disposed in the substrate 110 and may comprise a semiconductor material with a dopant. The dopant may have a conductivity type being n-type or p-type. In one embodiment, the substrate 110 includes silicon; while the pixel region 120 includes doped silicon as a light sensitive material.

The portions other than the pixel region 120 in the substrate 110 may be referred to as a non-pixel region. The transfer gate 150 is disposed on the non-pixel region of the substrate 110. The pixel region 120 may include a photodiode to sense incident light and enable the substrate 110 to generate charge carriers based on photoelectric effect in the pixel region 120. The charge carriers form an electrical current which is guided by the transfer gate 150 to other devices, such as transistors or other MOS devices. The transfer gate 150 may be surrounded by a spacer 160. In one embodiment, the transfer gate 150 includes a metal or a conductive material; and the spacer 160 includes a dielectric material, such as silicon oxide, silicon nitride, silicon oxynitride, silicon carbide, or any combinations thereof.

Both the substrate 110 and the pixel region 120 may have metal ions, dot-defects, or other impurities generated during the manufacturing. The heterogeneous layer 140 is disposed in the substrate 110 and in proximity to the pixel region 120 to provide a gettering of impurities 190, e.g. metal ions, dot-defects, or other impurities, in the substrate 110 and in the pixel region 120. In one embodiment, the distance between the heterogeneous layer 140 and the pixel region 120 is less than one micrometer. In another embodiment, the distance between the heterogeneous layer 140 and the pixel region 120 is less than 100 nanometers. In yet another embodiment, the distance between the heterogeneous layer 140 and the pixel region 120 is less than 10 nanometers.

In the example shown in FIG. 1, the heterogeneous layer 140 is disposed in a trench which has a bottom surface 135. The bottom surface 135 of the trench serves as a seed area for epitaxially growing the heterogeneous layer 140 in the trench. That is, the heterogeneous layer 140 is grown epitaxially on the seed area 135. In one embodiment, the heterogeneous layer 140 has a depth greater than that of the pixel region 120.

As shown in FIG. 1, the isolation region 130 is disposed in the substrate 110 and within a proximity of the pixel region 120. In one embodiment, the isolation region 130 is in direct contact with the pixel region 120. In the example shown in FIG. 1, the heterogeneous layer 140 is disposed in a trench that extends into the isolation region 130. As such, the isolation region 130 comprises the seed area 135 on which the heterogeneous layer 140 is grown on. As such, the heterogeneous layer 140 is surrounded by the isolation region 130 as shown in FIG. 1. In one embodiment, the isolation region 130 comprises a same semiconductor material as the substrate 110, and comprises a dopant configured for isolating the heterogeneous layer 140 from charge carriers generated in the substrate 110. The dopant may have a conductivity type being n-type or p-type.

In some embodiments, while the substrate 110 includes a first semiconductor material, the heterogeneous layer 140 includes a second semiconductor material that has a lattice constant different from that of the first semiconductor material. In one example, while the substrate 110 includes silicon (Si); the heterogeneous layer 140 may include a material with a larger lattice constant than silicon, e.g. germanium (Ge), silicon germanium (SiGe), germanium tin (GeSn), indium arsenide (InAs), or indium antimonide (InSb). In another example, while the substrate 110 includes silicon (Si); the heterogeneous layer 140 may include a material with a smaller lattice constant than silicon, e.g. silicon carbide (SiC), silicon borides (SiB), or phosphidosilicates (SiP).

Figure 2:
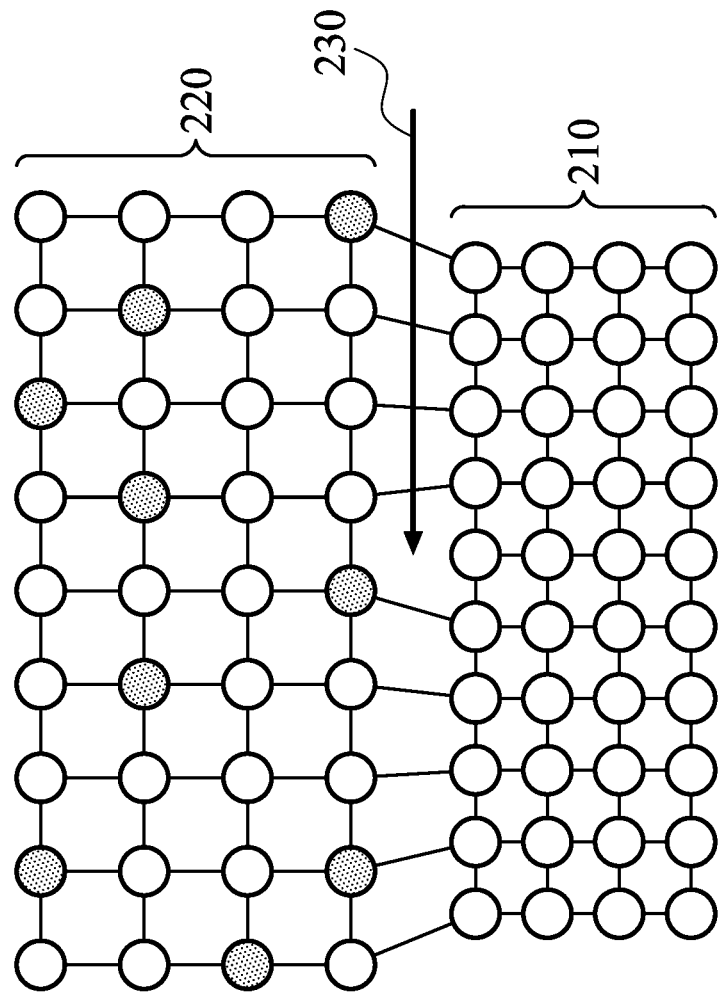
FIG. 2 illustrates a schematic cross-sectional view of a lattice structure at an interface of two semiconductor materials, in accordance with some embodiments of the present disclosure.

FIG. 2 illustrates a schematic cross-sectional view of a lattice structure 200 at an interface of two semiconductor materials 210, 220, in accordance with some embodiments of the present disclosure. As shown in FIG. 2, the lower material 210 may be Si as in the substrate 110 and in the seed area 135 of the isolation region 130 in FIG. 1; and the upper material 220 may be SiGe as in the heterogeneous layer 140 in FIG. 1. As shown in FIG. 2, because there is a lattice mismatch between the two materials Si and SiGe, a dislocation 230 is generated in the upper material 220 and at the interface between the two materials. The interface between the two materials may be called a hetero-interface.

Referring back to FIG. 1, due to the lattice match at the seed area 135, the heterogeneous layer 140 induces defects such as dislocations 141 and strains 142 at the hetero-interface, where the defects or strains can penetrate into the heterogeneous layer 140. In one embodiment, the strains, defects and dislocations in the heterogeneous layer 140 are located in proximity to the hetero-interfaces. The strains and defects induced by the heterogeneous layer 140 are extremely effective for gettering of impurities 190, e.g. metal ions, dot-defects, or other impurities, in the substrate 110 and the pixel region 120, especially after heat treatment.

In addition, the strains, defects and dislocations originated within the heterogeneous layer 140 terminate at the hetero-interfaces between the heterogeneous layer 140 and the isolation region 130. That is, the strains, defects and dislocations are located within the heterogeneous layer 140, but not within the isolation region 130 or other portions of the substrate 110. The clear boundary of the heterogeneous layer 140 confines the strains, defects and dislocations within the heterogeneous layer 140, which ensures that no defect will extend from the heterogeneous layer 140 into the substrate 110 or the pixel region 120 to cause silicon damage.

Figure 3A:
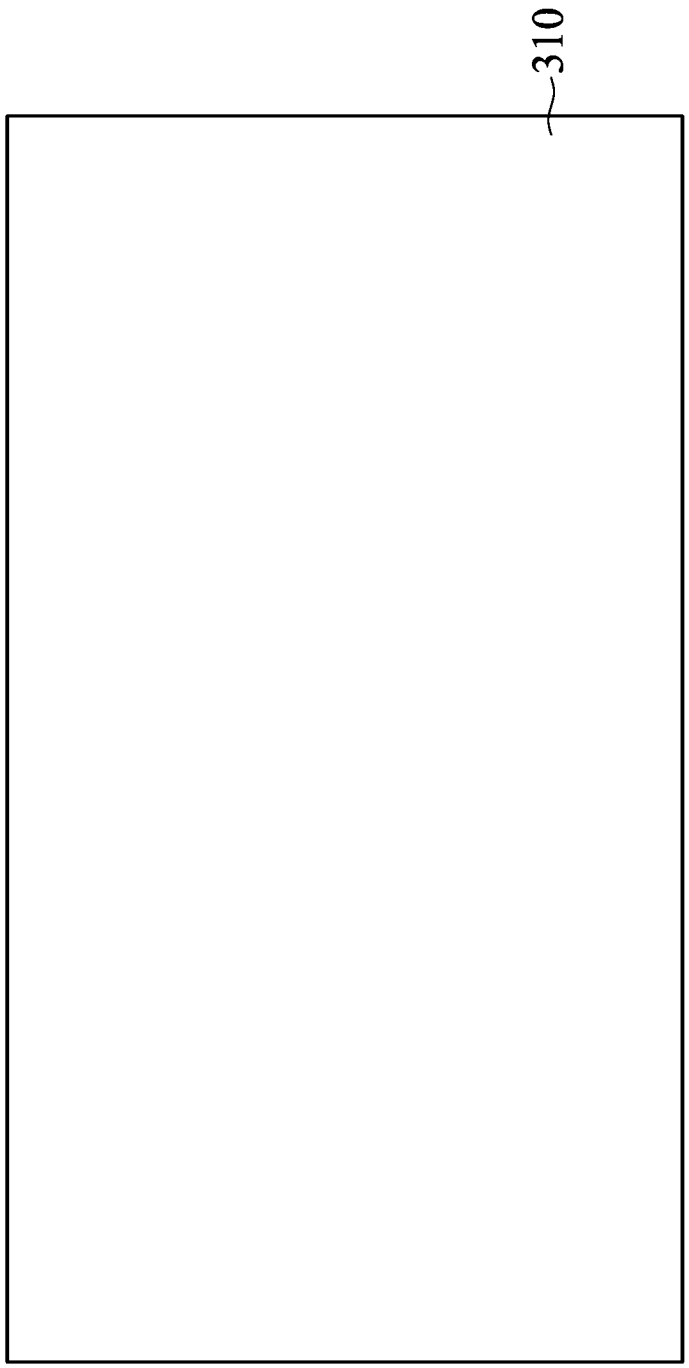
FIG. 3A through FIG. 3K are schematic cross-sectional views of intermediate stages showing a method for manufacturing a device comprising at least one pixel cell, in accordance with some embodiments of the present disclosure.

FIG. 3A through FIG. 3K are schematic cross-sectional views of intermediate stages showing a method for manufacturing a semiconductor device comprising at least one pixel cell, e.g. the semiconductor device 100 in FIG. 1, in accordance with some embodiments of the present disclosure. FIG. 3A is a cross-sectional view of the semiconductor device including a semiconductor substrate 310, which is provided at one of the various stages of fabrication, according to some embodiments of the present disclosure. The semiconductor substrate 310 may be provided to include a group IV material, a group IV material compound, or a group III-V material compound. For example, the group IV material may be Si.

Figure 3B:
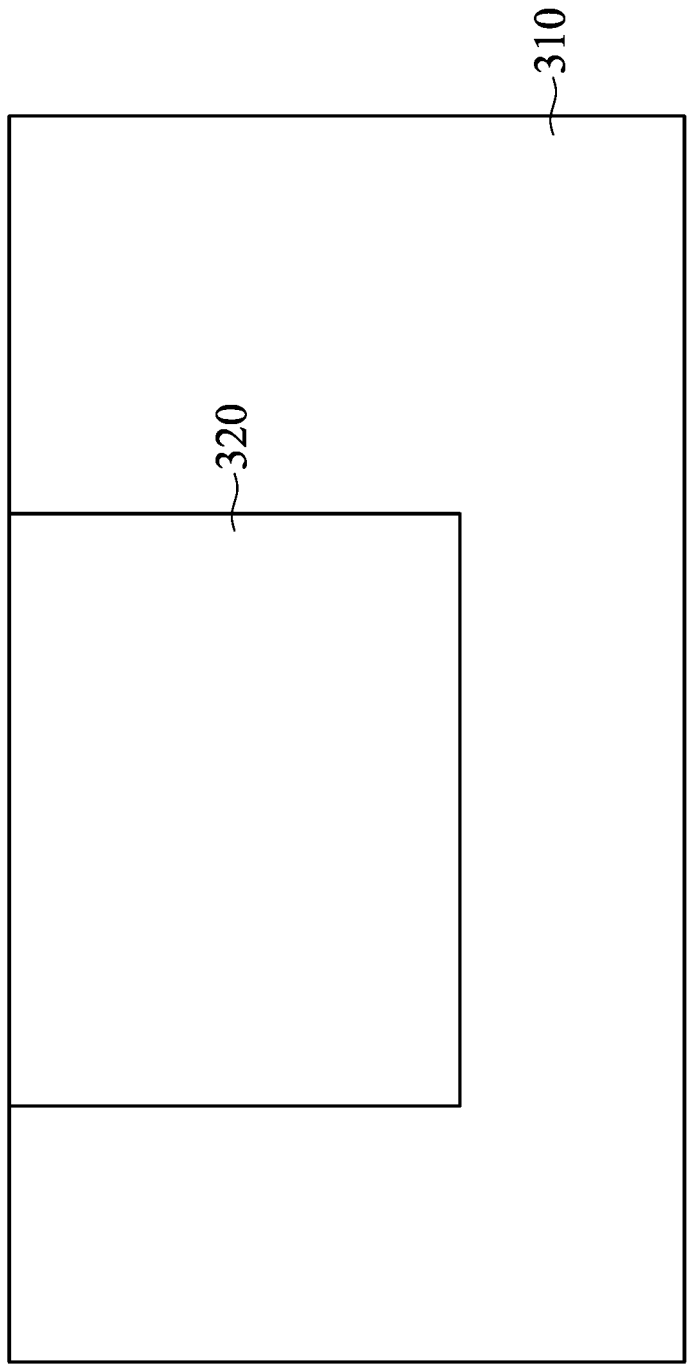

FIG. 3B is a cross-sectional view of the semiconductor device including a pixel region 320, which is formed inside the substrate 310 at one of the various stages of fabrication, according to some embodiments of the present disclosure. The pixel region 320 may be formed by doping a dopant into the substrate 310. The dopant may have a conductivity type being n-type or p-type. The remaining portion in the substrate 310 other than the pixel region 320 may be referred to as a non-pixel region.

Figure 3C:
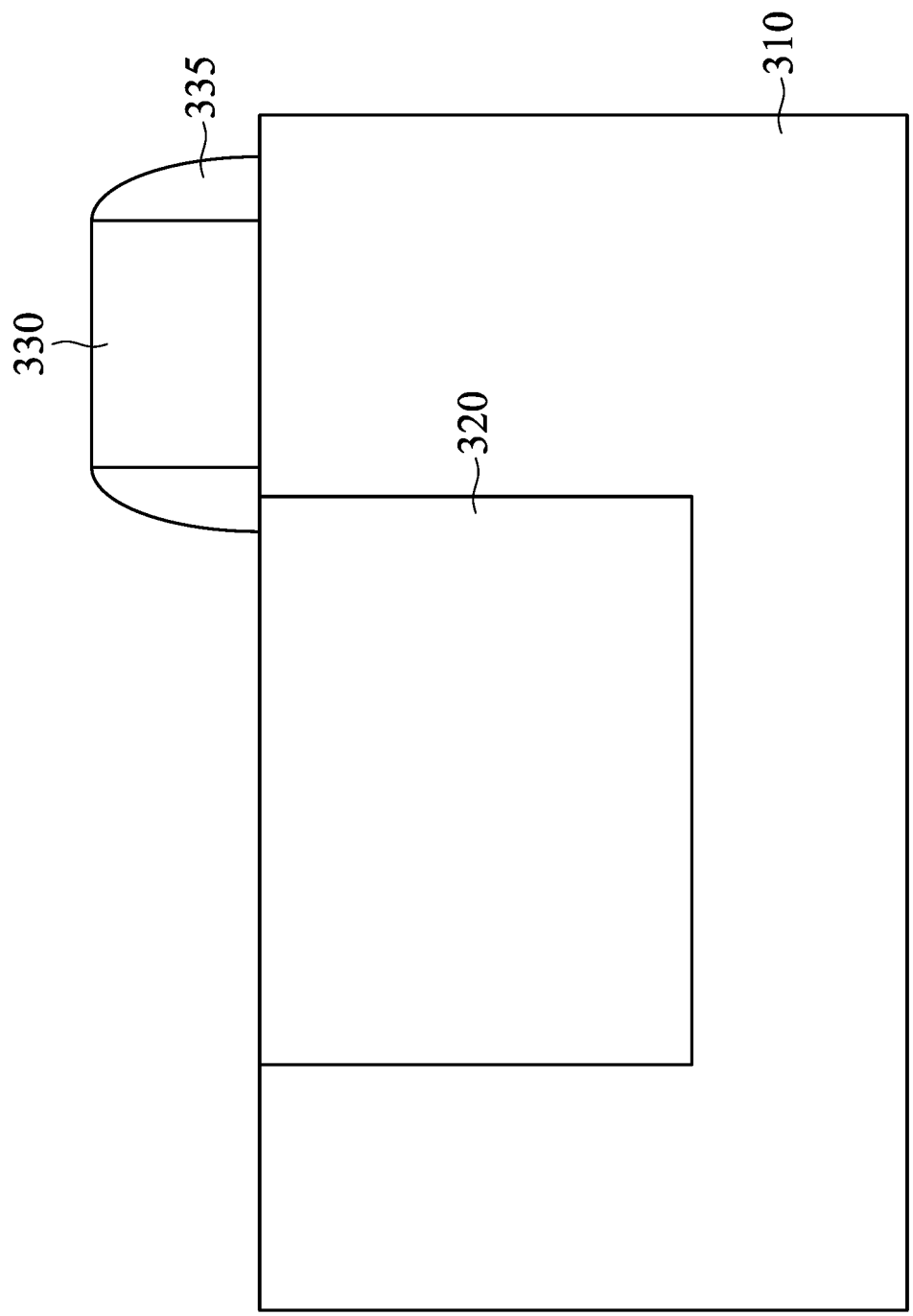

As shown in FIG. 3C, a transfer gate 330 is formed on and in contact with the non-pixel region of the substrate 310. Optionally, as shown in FIG. 3C, a spacer 335 is formed around the transfer gate 330 on top of the substrate 310. In one embodiment, the transfer gate 330 includes a metal or a conductive material; and the spacer 335 includes a dielectric material, such as silicon oxide, silicon nitride, silicon oxynitride, silicon carbide, or any combinations thereof.

Figure 3D:
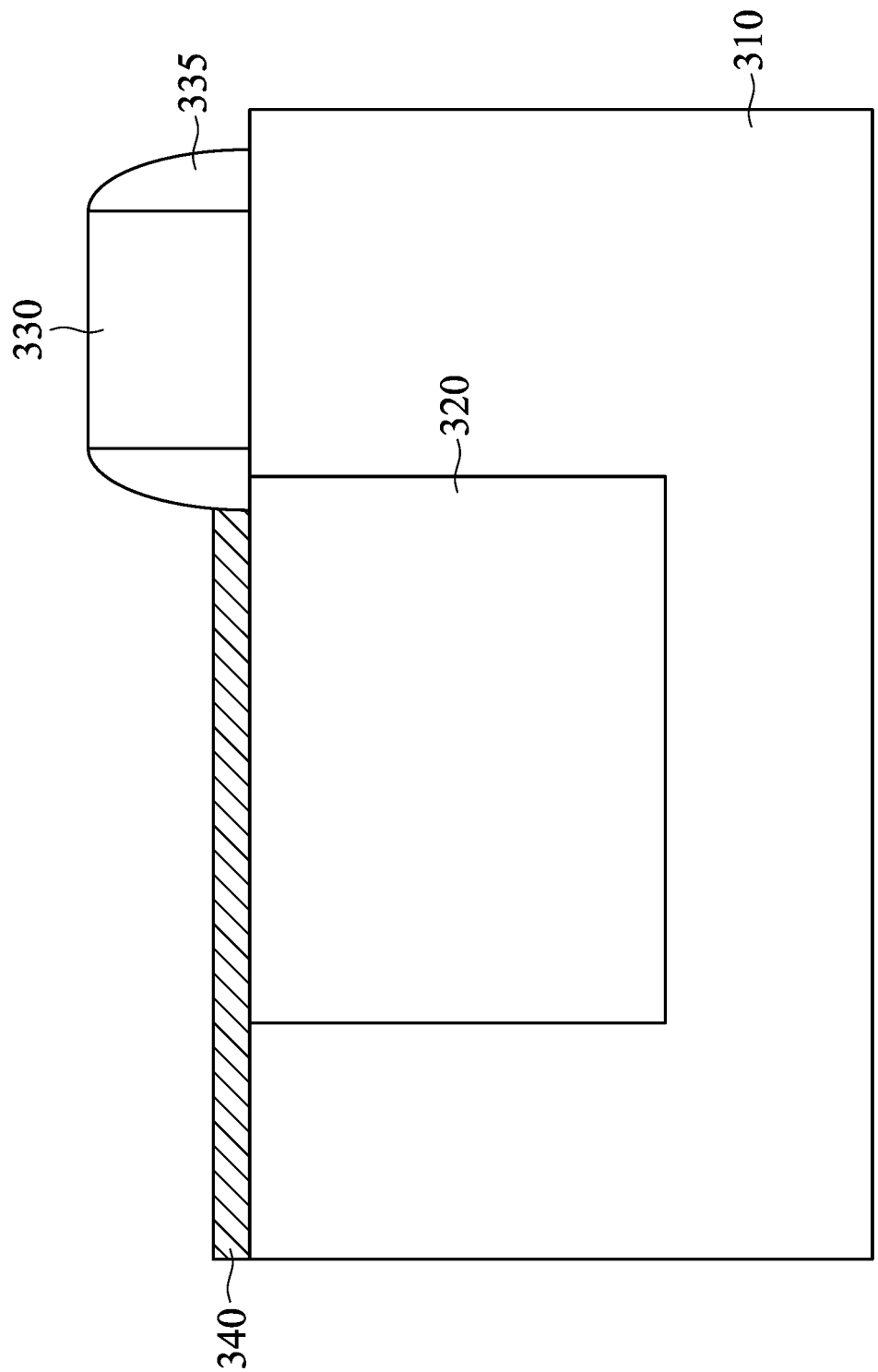

As shown in FIG. 3D, a hard mask 340 is deposited on the substrate 310 and the pixel region 320, at one of the various stages of fabrication, according to some embodiments of the present disclosure. In one embodiment, the hard mask 340 may include materials like: silicon oxide, silicon nitride, silicon oxynitride, etc.

Figure 3E:
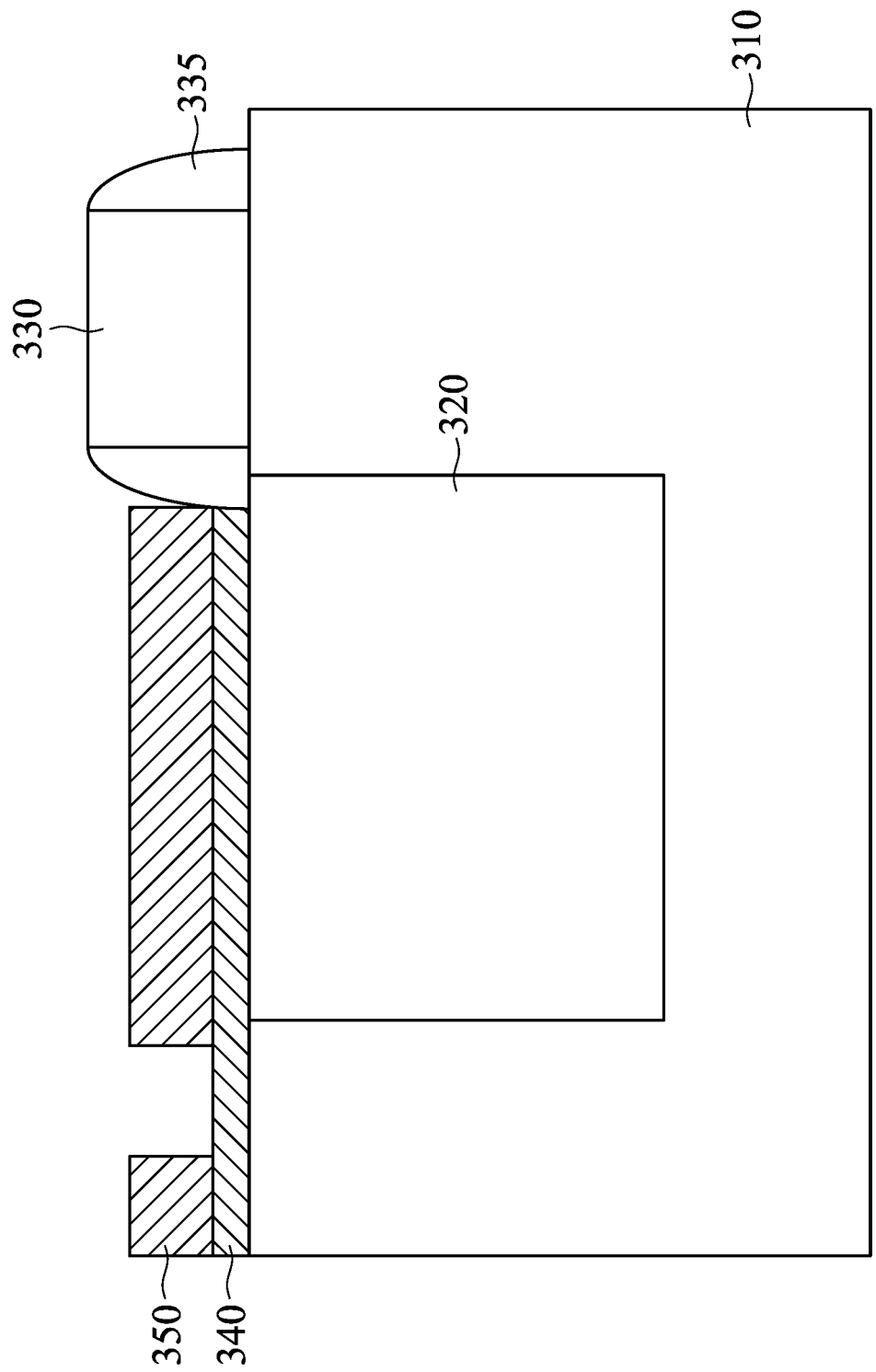

In some exemplary examples, as shown in FIG. 3E, a patterned photoresist 350 is deposited on the hard mask 340, at one of the various stages of fabrication, according to some embodiments of the present disclosure. In one embodiment, the patterned photoresist 350 may include materials like SEPR602.

Figure 3F:
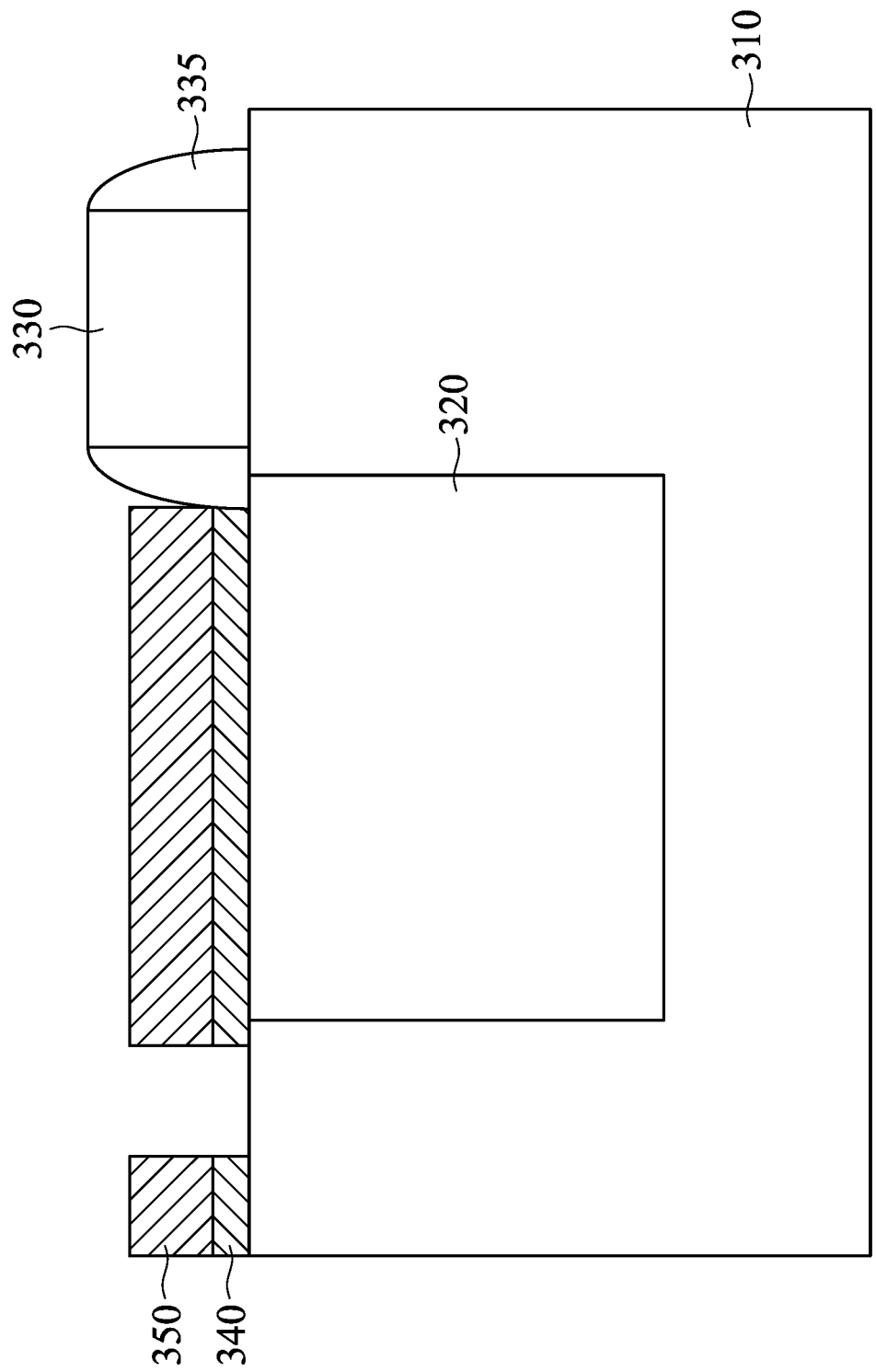

As shown in FIG. 3F, the hard mask 340 is etched to have a pattern determined based on the patterned photoresist 350, at one of the various stages of fabrication, according to some embodiments of the present disclosure. In the example shown in FIG. 3F, the pattern provides an opening of the hard mask 340 on top of the substrate 310 near the pixel region 320.

Figure 3G:
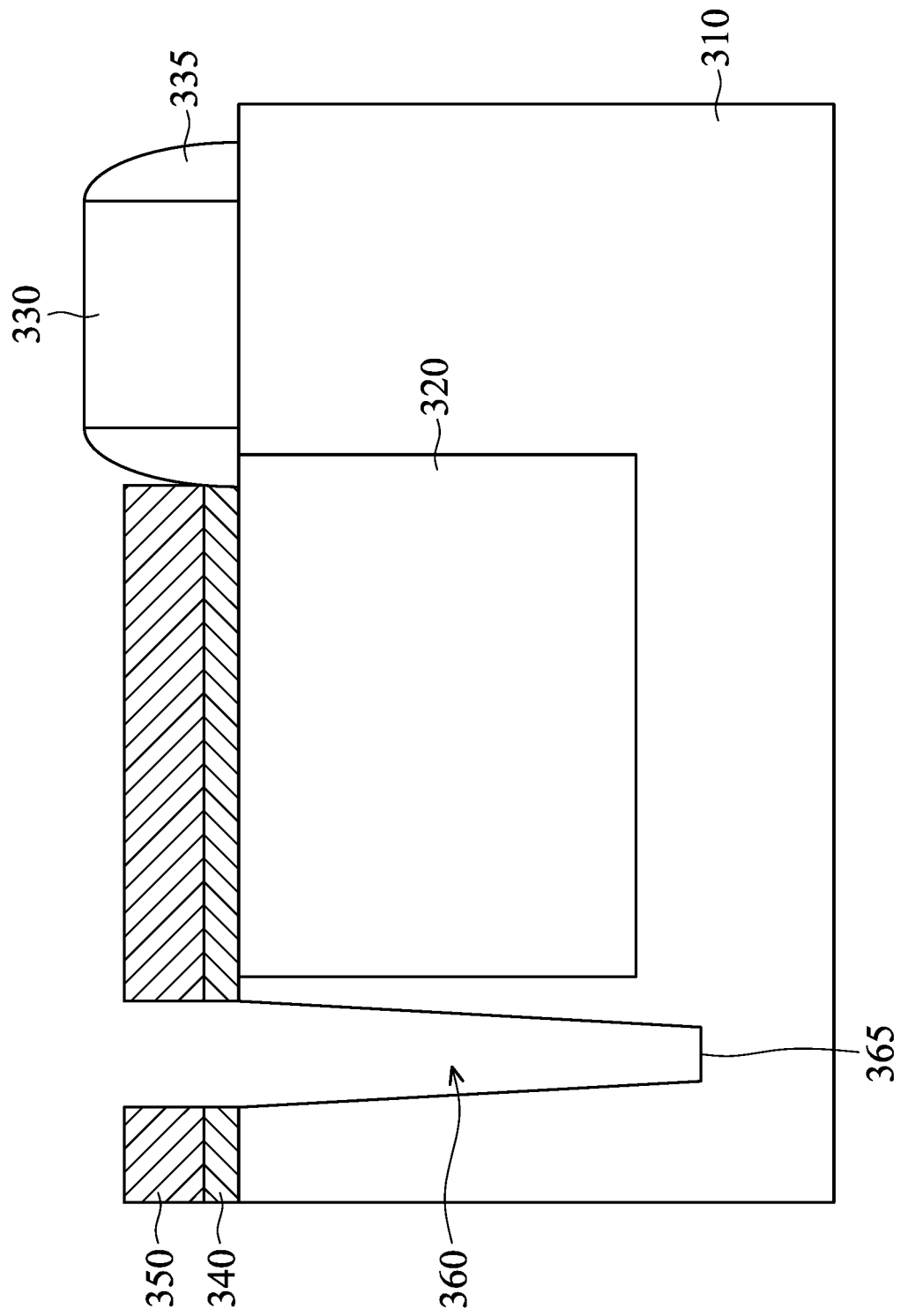

As shown in FIG. 3G, the substrate 310 is etched to form a trench 360 based on the patterned photoresist 350 and the hard mask 340, at one of the various stages of fabrication, according to some embodiments of the present disclosure. In the example shown in FIG. 3G, the trench 360 extends from the opening of the hard mask 340 into the substrate 310 and within a proximity of the pixel region 320. The distance between the trench 360 and the pixel region 320 may be less than one micrometer, less than 100 nanometers, or less than 10 nanometers, according to various embodiments. The trench 360 has a bottom surface 365 that has a same semiconductor material as the substrate 310.

Figure 3H:
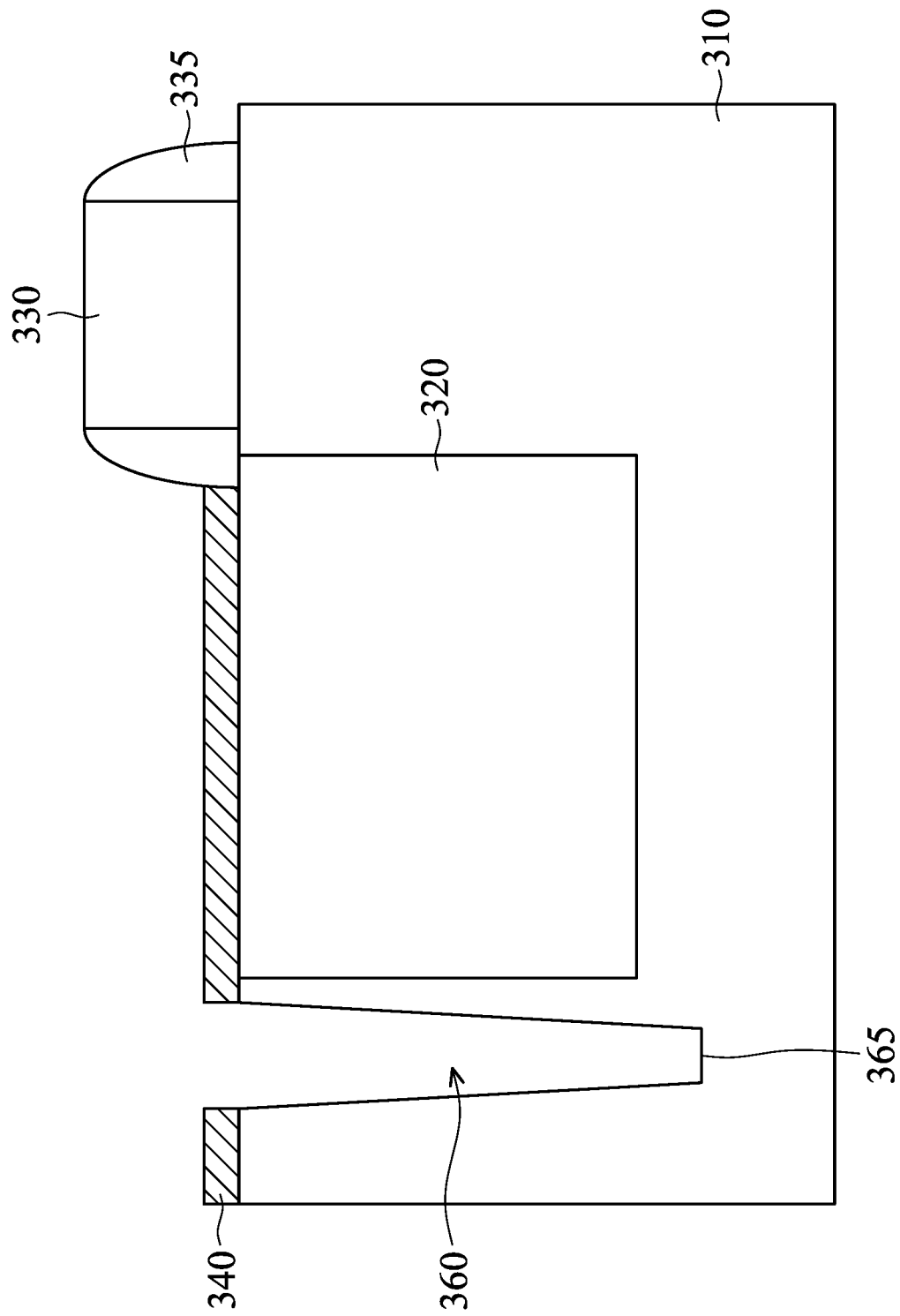

As shown in FIG. 3H, the patterned photoresist 350 is optionally removed after forming the trench 360, at one of the various stages of fabrication, according to some embodiments of the present disclosure. For example, the patterned photoresist 350 may be removed by using an etching process, a polishing process or a thinning process.

Figure 3I:
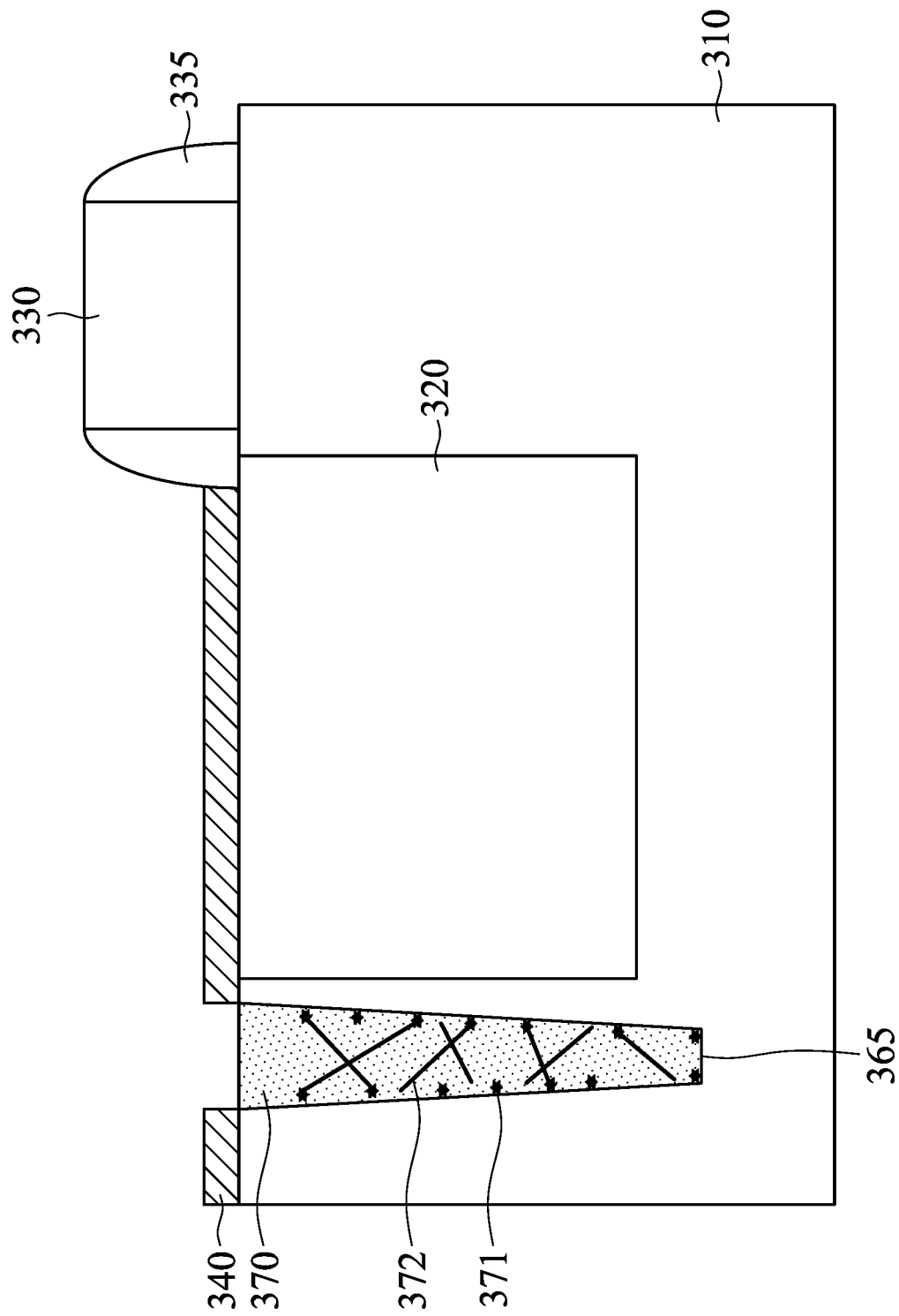

As shown in FIG. 3I, a heterogeneous layer 370 is formed in the trench 360 to fill the trench 360, at one of the various stages of fabrication, according to some embodiments of the present disclosure. In the example shown in FIG. 3I, the heterogeneous layer 370 is epitaxially grown on the bottom surface 365 of the trench 360. While the bottom surface 365 and the substrate 310 include a first semiconductor material, the heterogeneous layer 370 comprises a second semiconductor material that has a lattice constant different from that of the first semiconductor material. For example, when the first semiconductor material is silicon, the heterogeneous layer 370 may include a material with a larger lattice constant than silicon, e.g. Ge, SiGe, GeSn, InAs, or InSb; or include a material with a smaller lattice constant than silicon, e.g. SiC, SiB, or SiP. Due to the lattice mismatch between the first semiconductor material and the second semiconductor material, defects such as dislocations 371 and strains 372 are formed within the heterogeneous layer 370 and terminate at the hetero-interfaces between the heterogeneous layer 370 and the substrate 310.

Figure 3J:
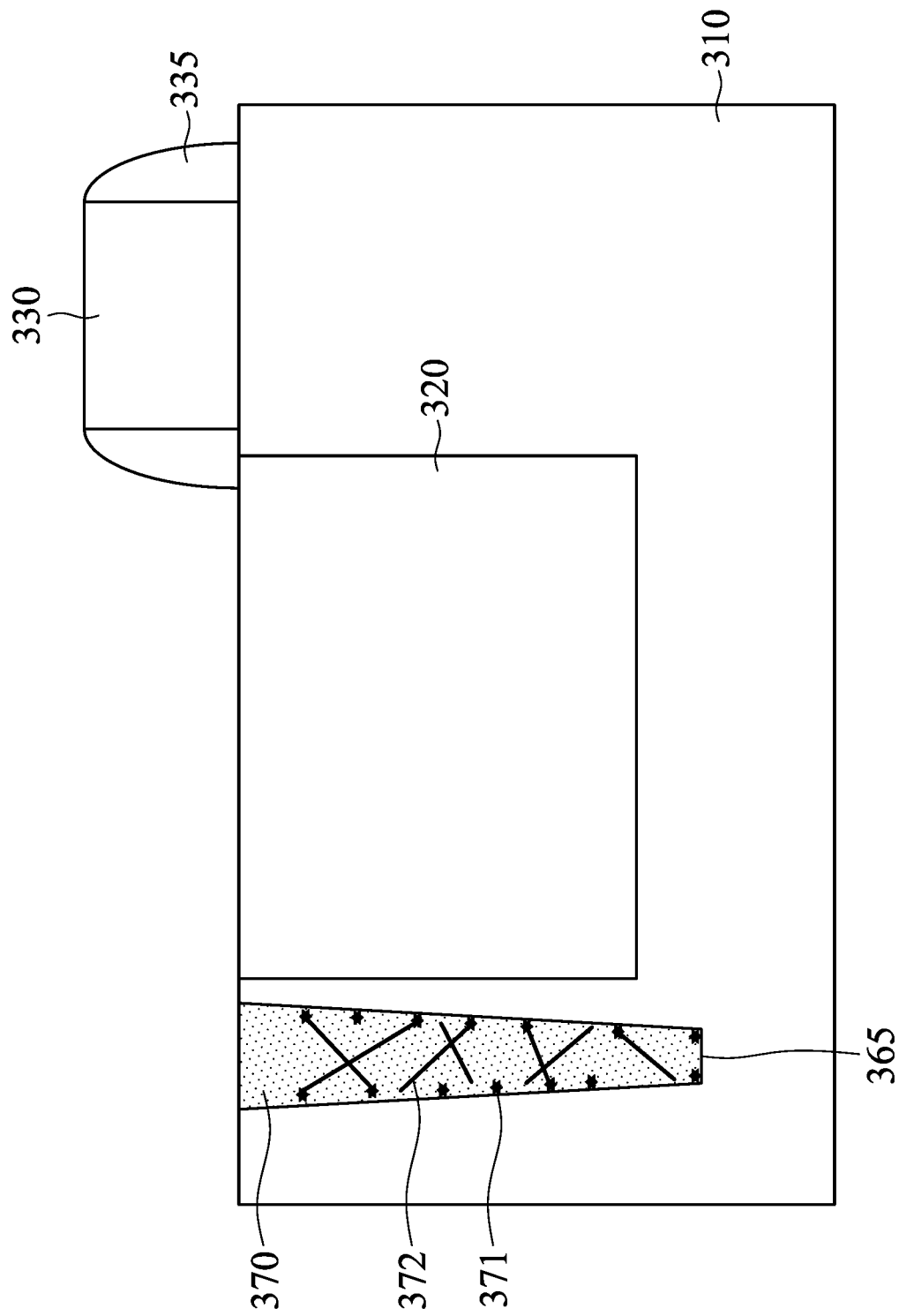

As shown in FIG. 3J, the hard mask 340 is optionally removed after forming the heterogeneous layer 370, at one of the various stages of fabrication, according to some embodiments of the present disclosure. For example, the hard mask 340 may be removed by using an etching process, a polishing process or a thinning process. This forms a semiconductor device 300.

Figure 3K:
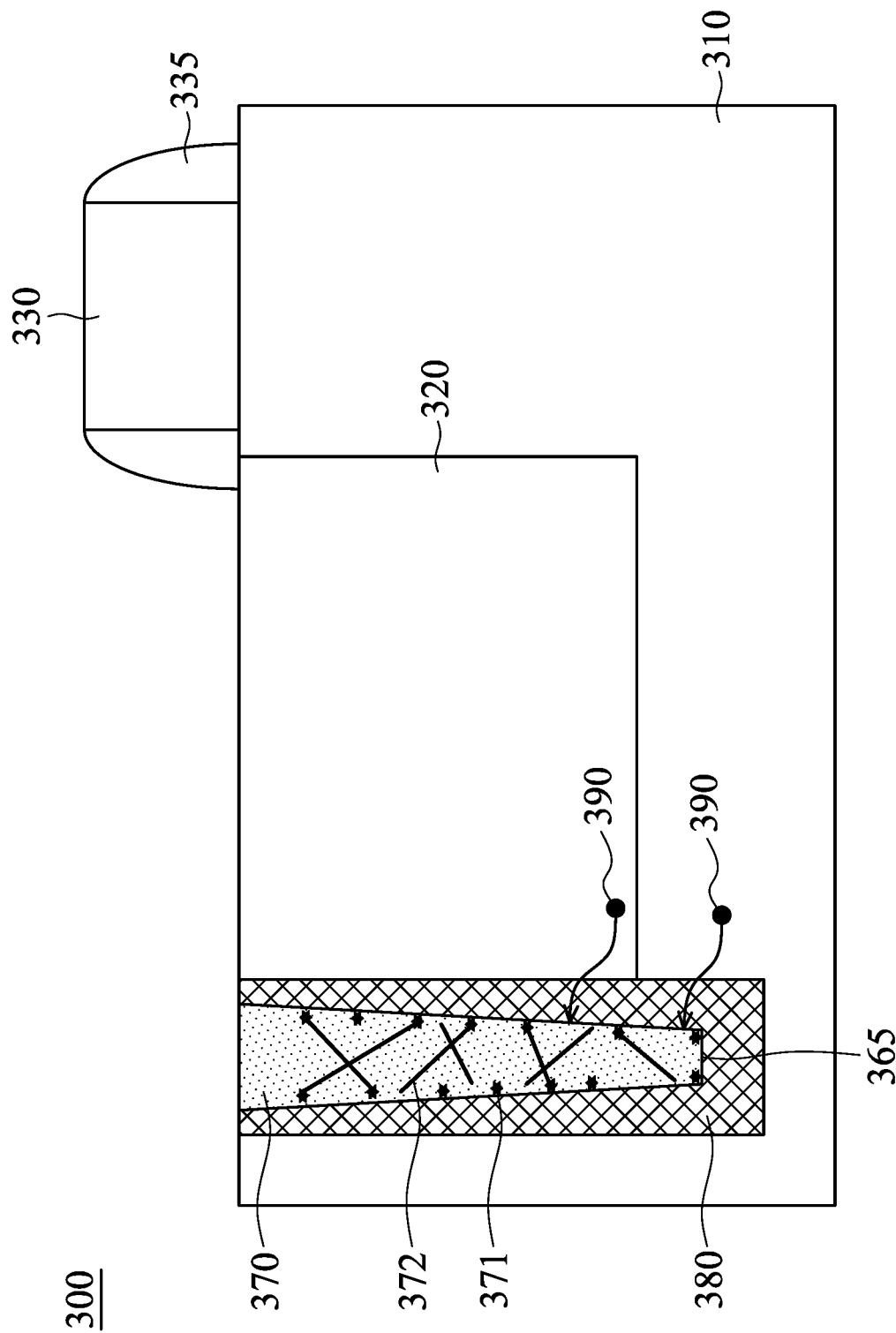

In some examples, the heterogeneous layer 370 is formed by epitaxially growing the second semiconductor material with a dopant in the trench. The dopant may have a conductivity type being n-type or p-type. Then as shown in FIG. 3K, the device 300 may be annealed so as to drive the dopant into the substrate 310 to form an isolation region 380 around the heterogeneous layer 370. The heterogeneous layer 370 can provide a gettering of impurities 390, e.g. metal ions, dot-defects, or other impurities, in the substrate 310 and in the pixel region 320. The isolation region 380 provides an electrically neutral region for isolating the heterogeneous layer 370 from charge carriers generated in the substrate 310 based on, e.g. an incident light into the light sensing materials in the pixel region 320.

Figure 4:
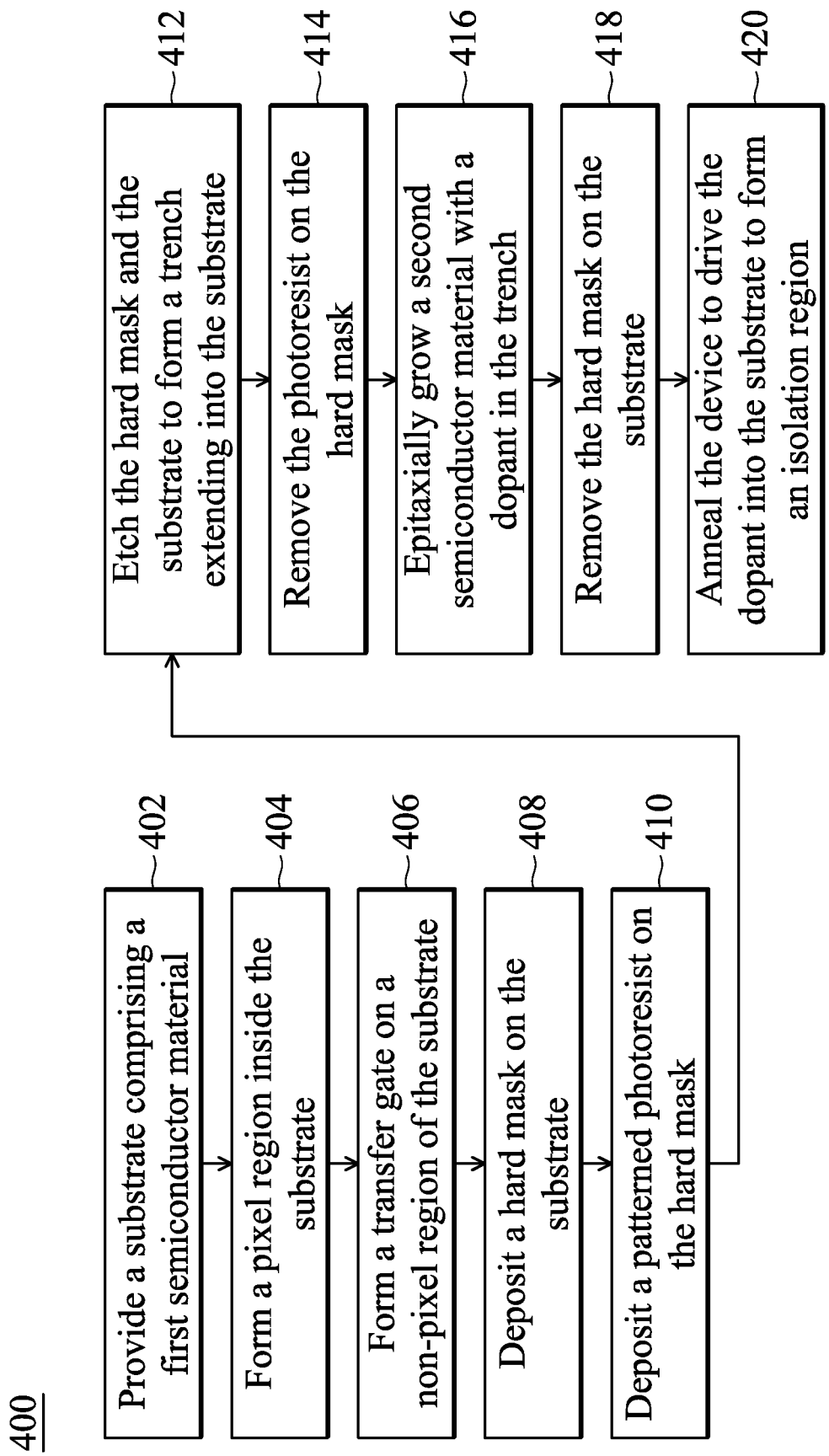
FIG. 4 illustrates a flow chart of a method for manufacturing a device comprising at least one pixel cell, in accordance with some embodiments of the present disclosure.

FIG. 4 illustrates a flow chart of a method 400 for manufacturing a device comprising at least one pixel cell, e.g. the semiconductor device 100 in FIG. 1, in accordance with some embodiments of the present disclosure. The method begins at operation 402, where a substrate comprising a first semiconductor material is provided. At operation 404, a pixel region is formed inside the substrate, where the remaining portion of the substrate other than the pixel region forms a non-pixel region.

At operation 406, a transfer gate is formed on the non-pixel region of the substrate. At operation 408, a hard mask is deposited on the substrate. At operation 410, a patterned photoresist is deposited on the hard mask. At operation 412, the hard mask and the substrate are etched to form a trench extending into the substrate.

At operation 414, the photoresist on the hard mask is removed. At operation 416, a second semiconductor material is epitaxially grown with a dopant in the trench to form a heterogeneous layer. The dopant may have a conductivity type being n-type or p-type. At operation 418, the hard mask on the substrate is removed to form a device. At operation 420, the device is annealed to drive the dopant into the substrate to form an isolation region around the heterogeneous layer.

Figure 5A:
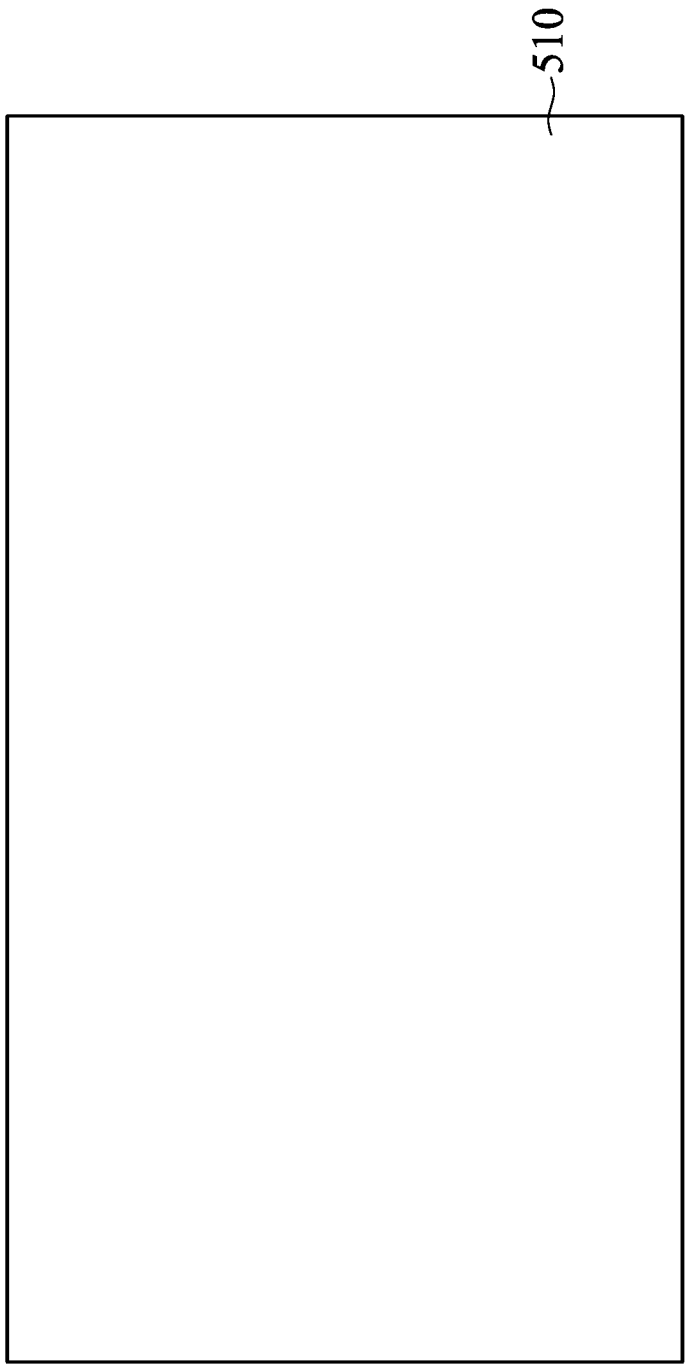
FIG. 5A through FIG. 5K are schematic cross-sectional views of intermediate stages showing another method for manufacturing a device comprising at least one pixel cell, in accordance with some embodiments of the present disclosure.
Figure 5B:
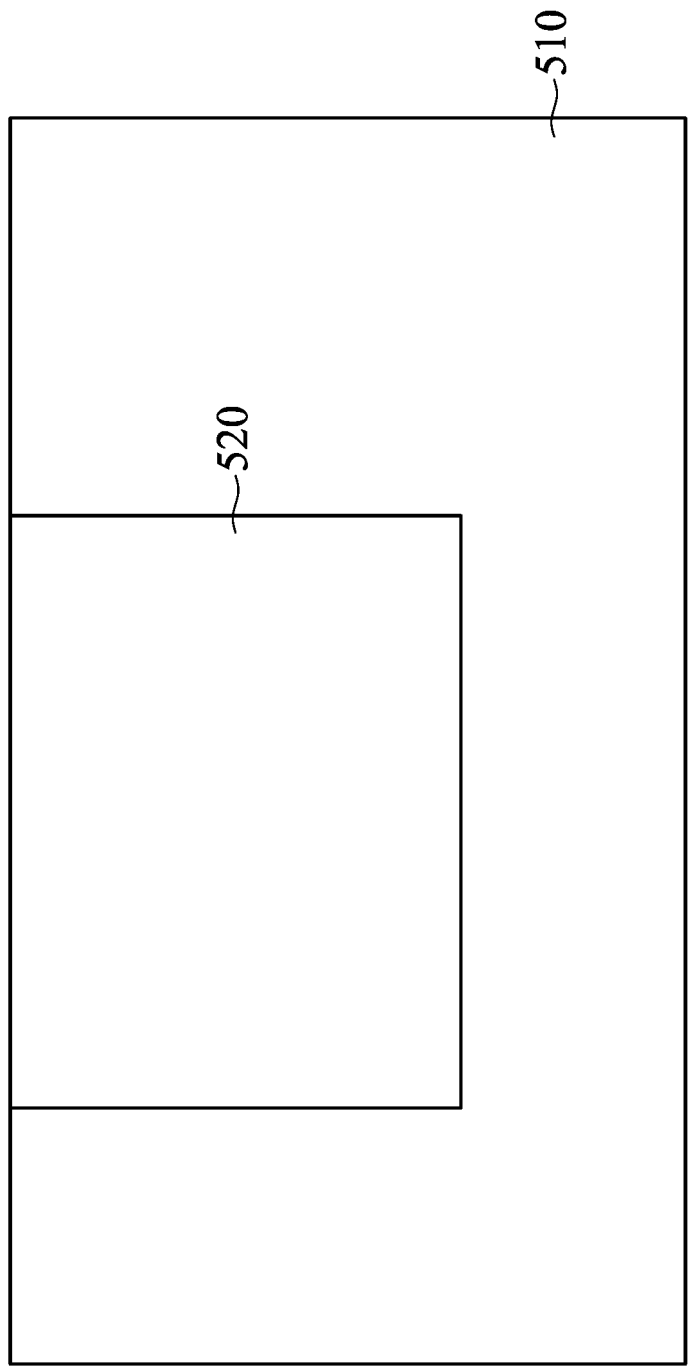
Figure 5C:
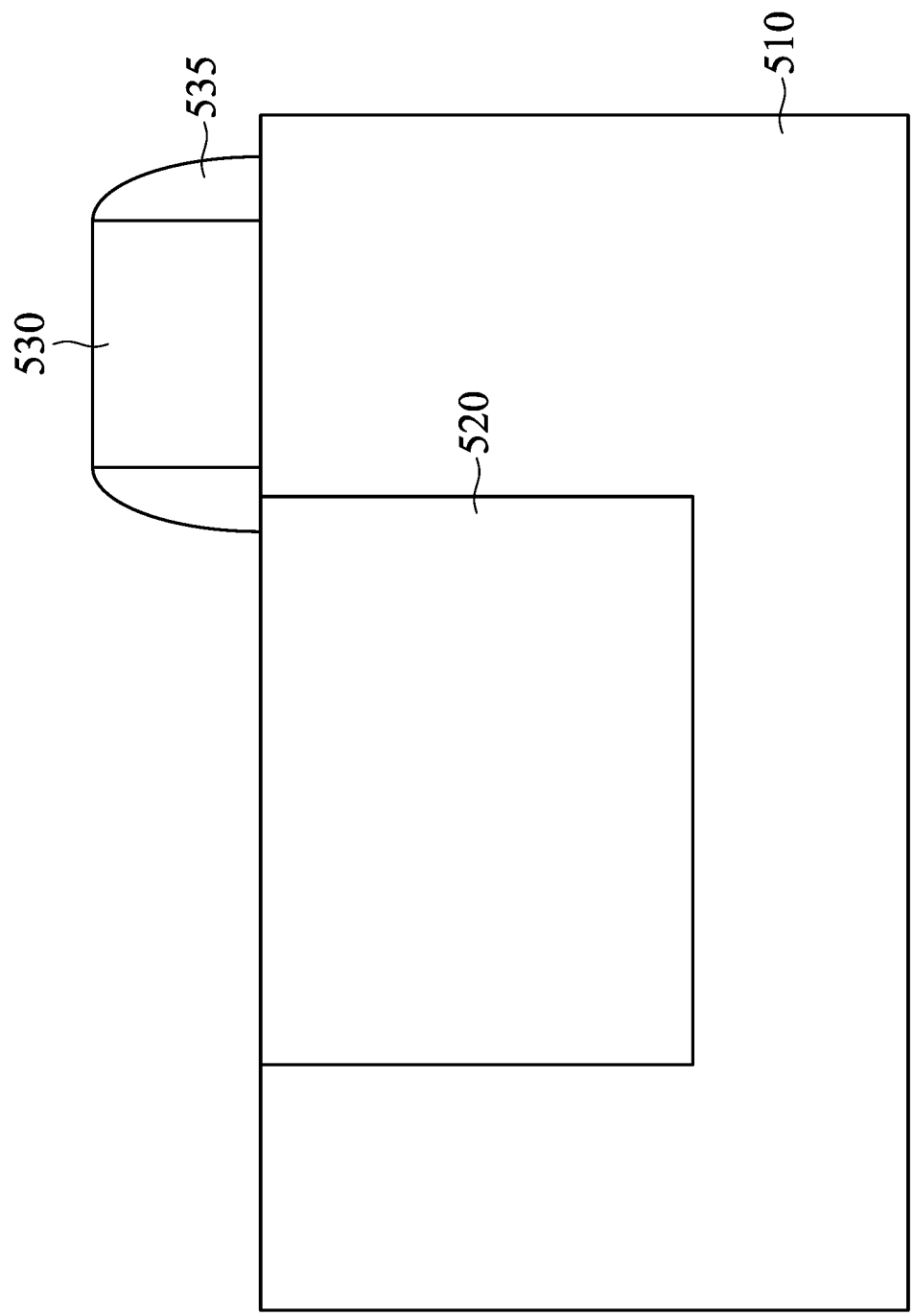
Figure 5D:
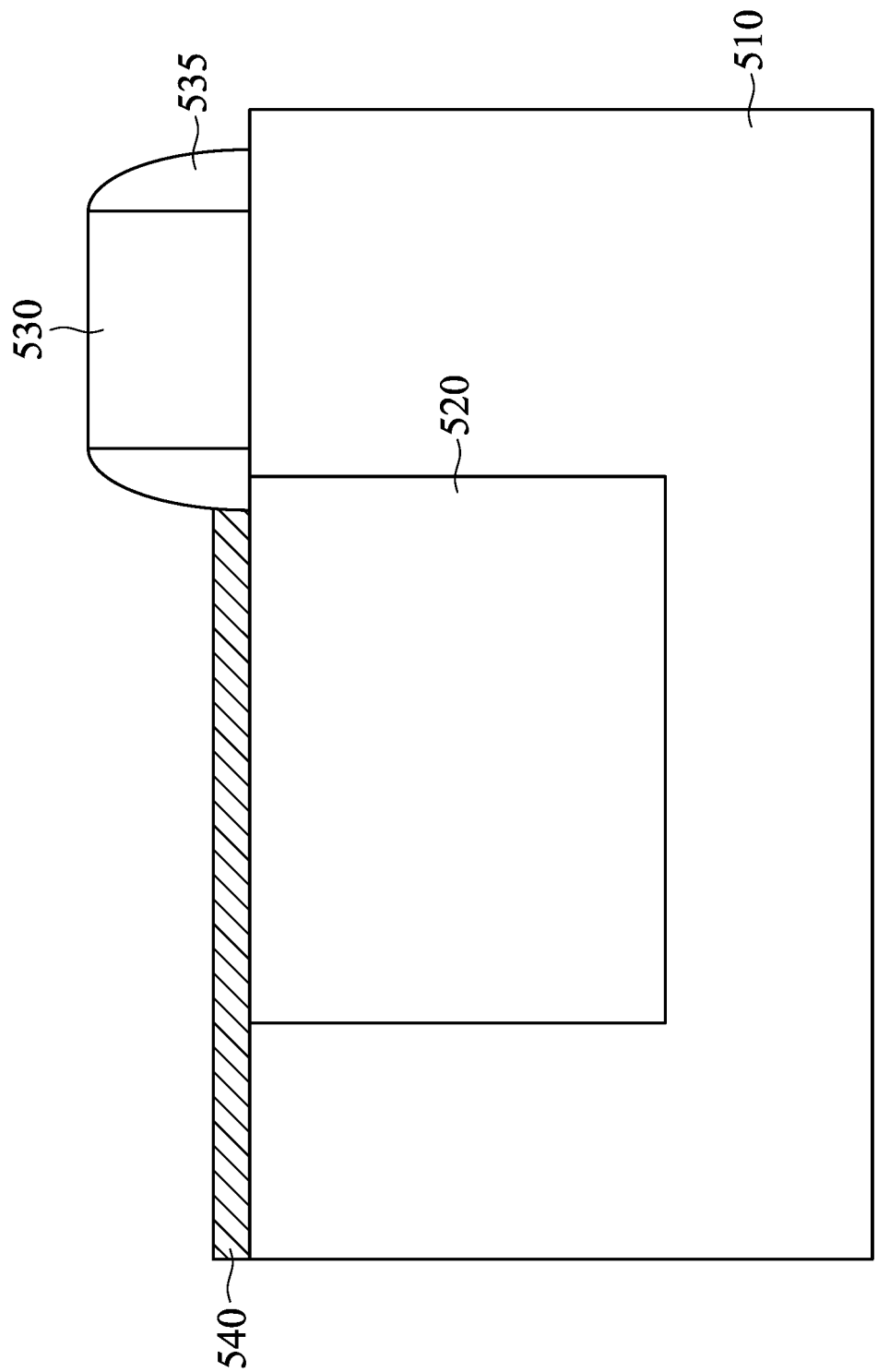
Figure 5E:
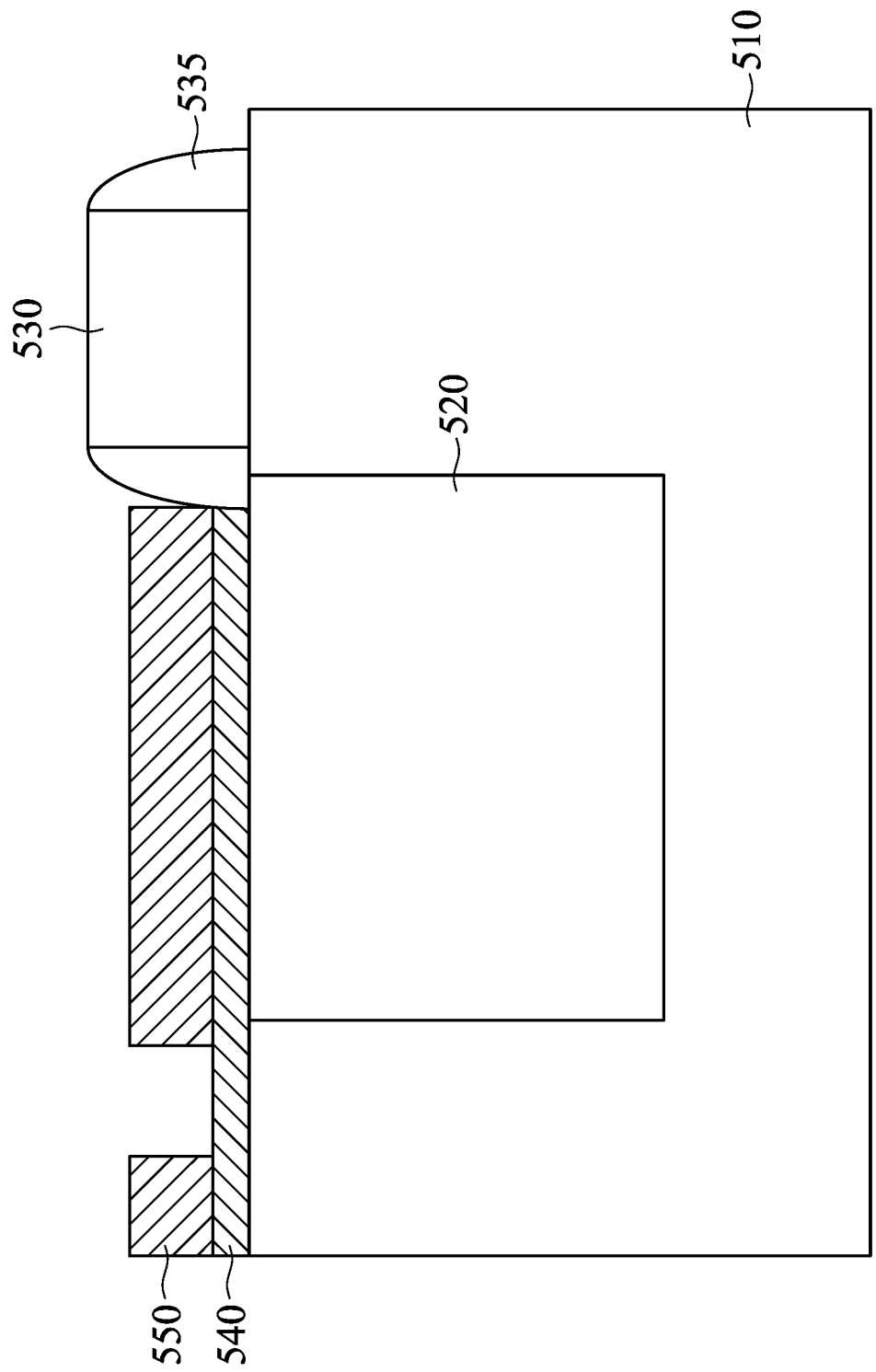
Figure 5F:
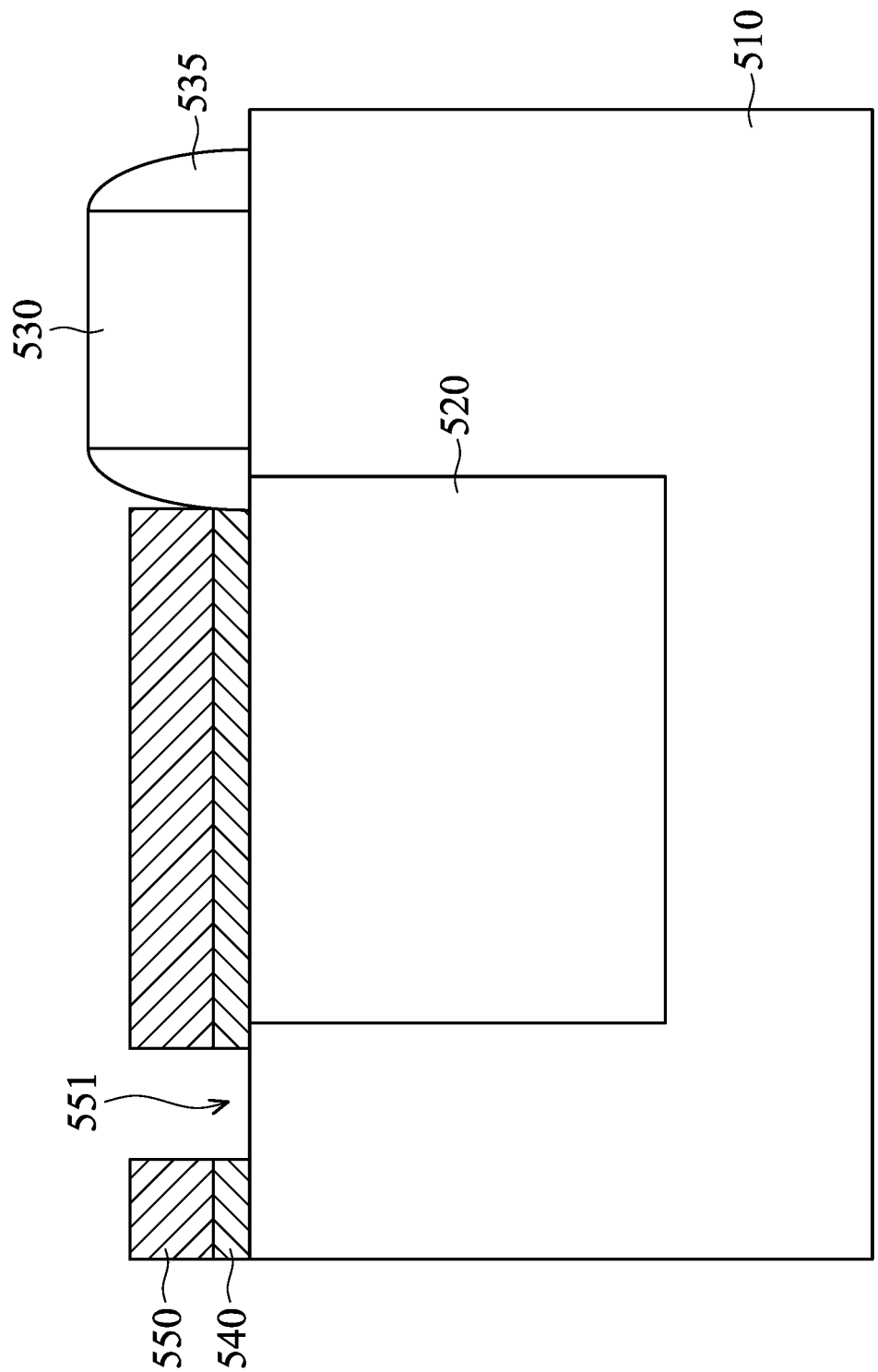

FIG. 5A through FIG. 5K are schematic cross-sectional views of intermediate stages showing another method for manufacturing a device comprising at least one pixel cell, e.g. the semiconductor device 100 in FIG. 1, in accordance with some embodiments of the present disclosure. The stages of the method shown from FIG. 5A to FIG. 5F are similar to the stages shown in FIG. 2A to FIG. 2F, respectively. As shown in FIG. 5F, the hard mask 540 is etched to provide an opening 551 on top of the substrate 510 near the pixel region 520, based on the patterned photoresist 550.

Figure 5G:
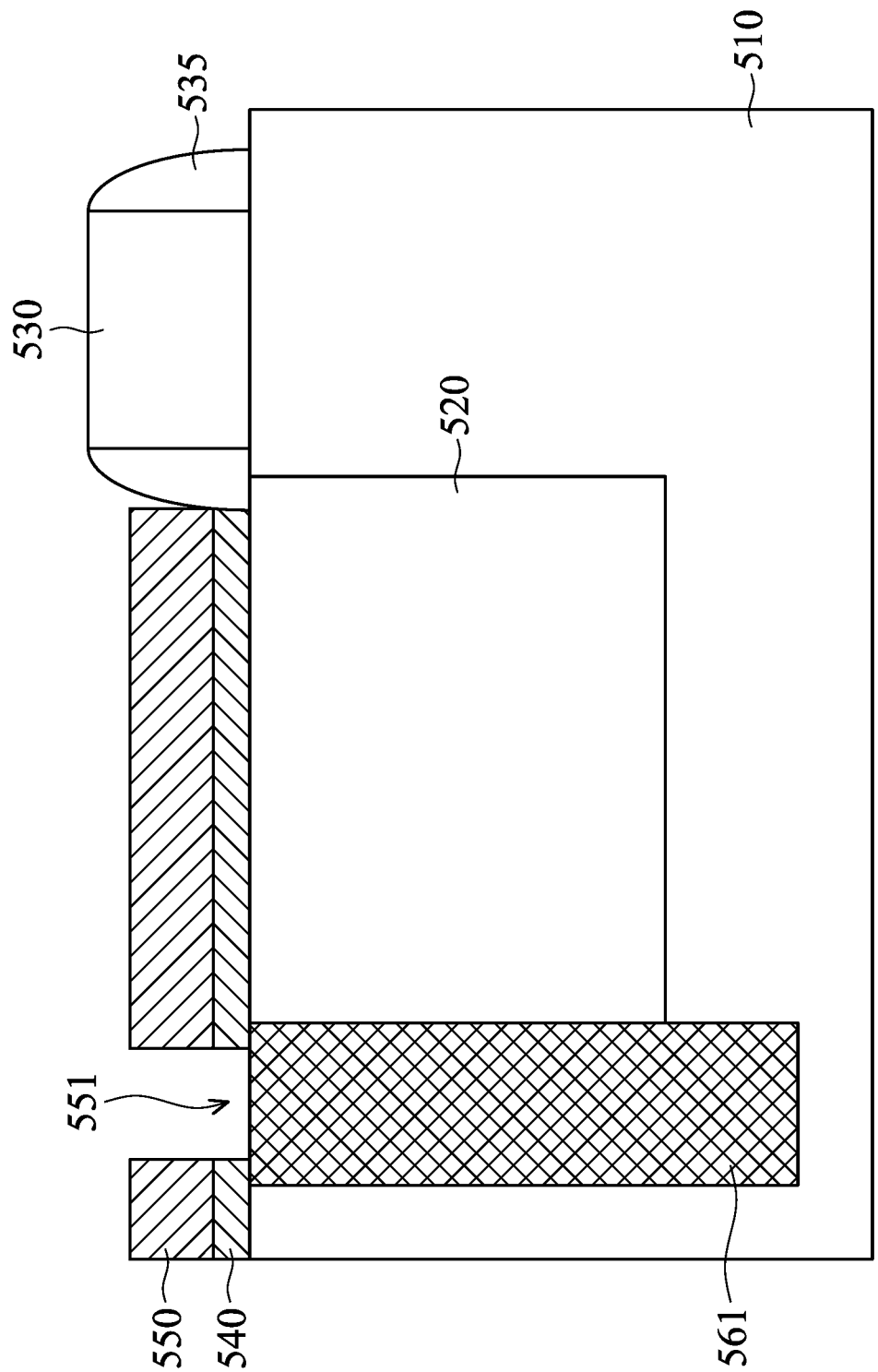

As shown in FIG. 5G, an isolation region 561 is formed inside the substrate 510 by, e.g. doping the substrate 510 with a dopant via the opening 551 to provide the isolation region 561. The dopant may have a conductivity type being n-type or p-type. The isolation region 561 is an electrically neutral region disposed in the substrate 510 and close to the pixel region 520.

Figure 5H:
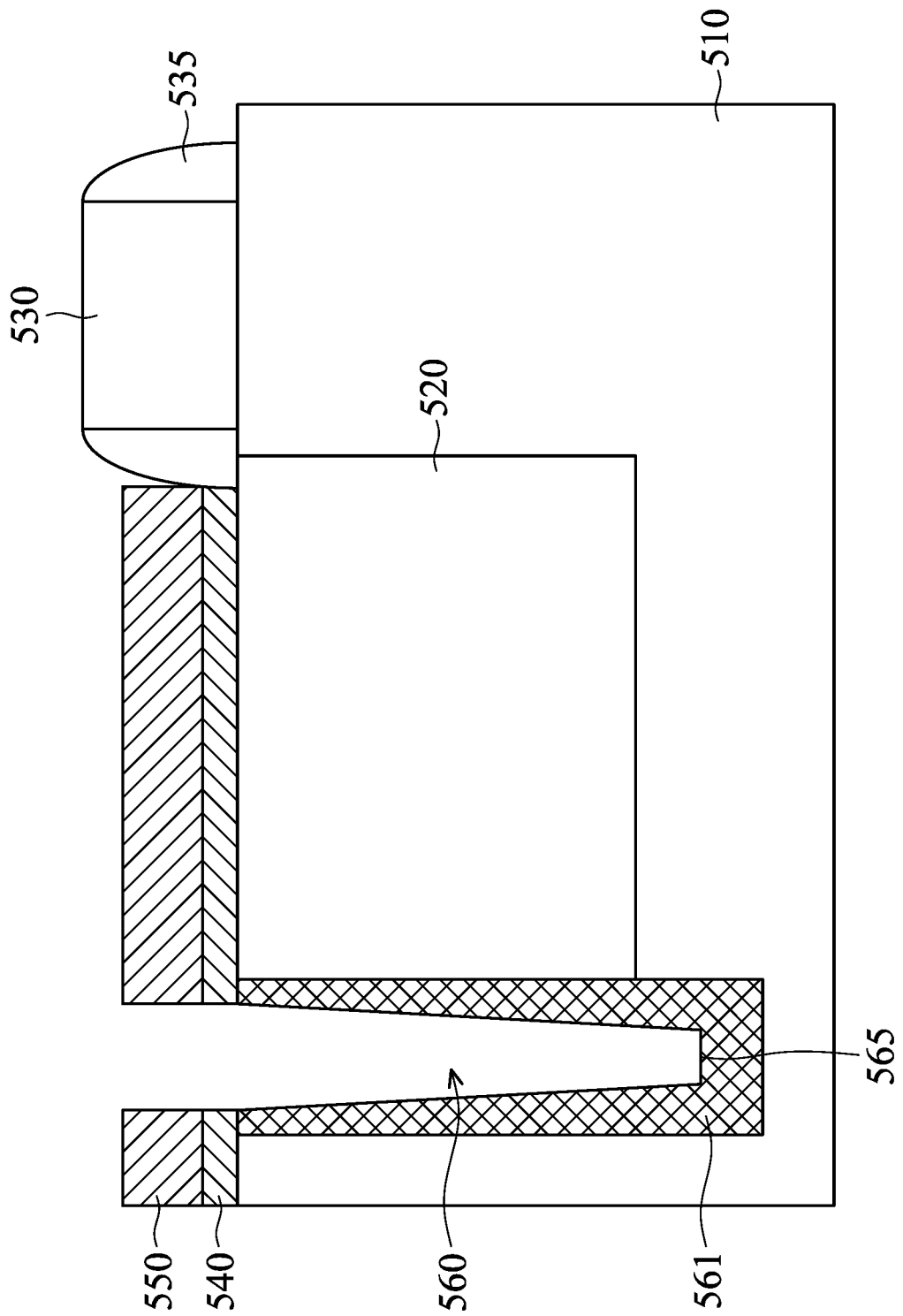

As shown in FIG. 5H, the isolation region 561 in the substrate 510 is etched to form a trench 560 based on the patterned photoresist 550 and the patterned hard mask 540, at one of the various stages of fabrication, according to some embodiments of the present disclosure. In the example shown in FIG. 5G, the trench 560 extends from the opening of the hard mask 540 into the isolation region 561 and within a proximity of the pixel region 520. The distance between the trench 560 and the pixel region 520 may be less than one micrometer, less than 100 nanometers, or less than 10 nanometers, according to various embodiments. The trench 560 has a bottom surface 565 that has the same semiconductor material as the isolation region 561 and the substrate 510.

Figure 5I:
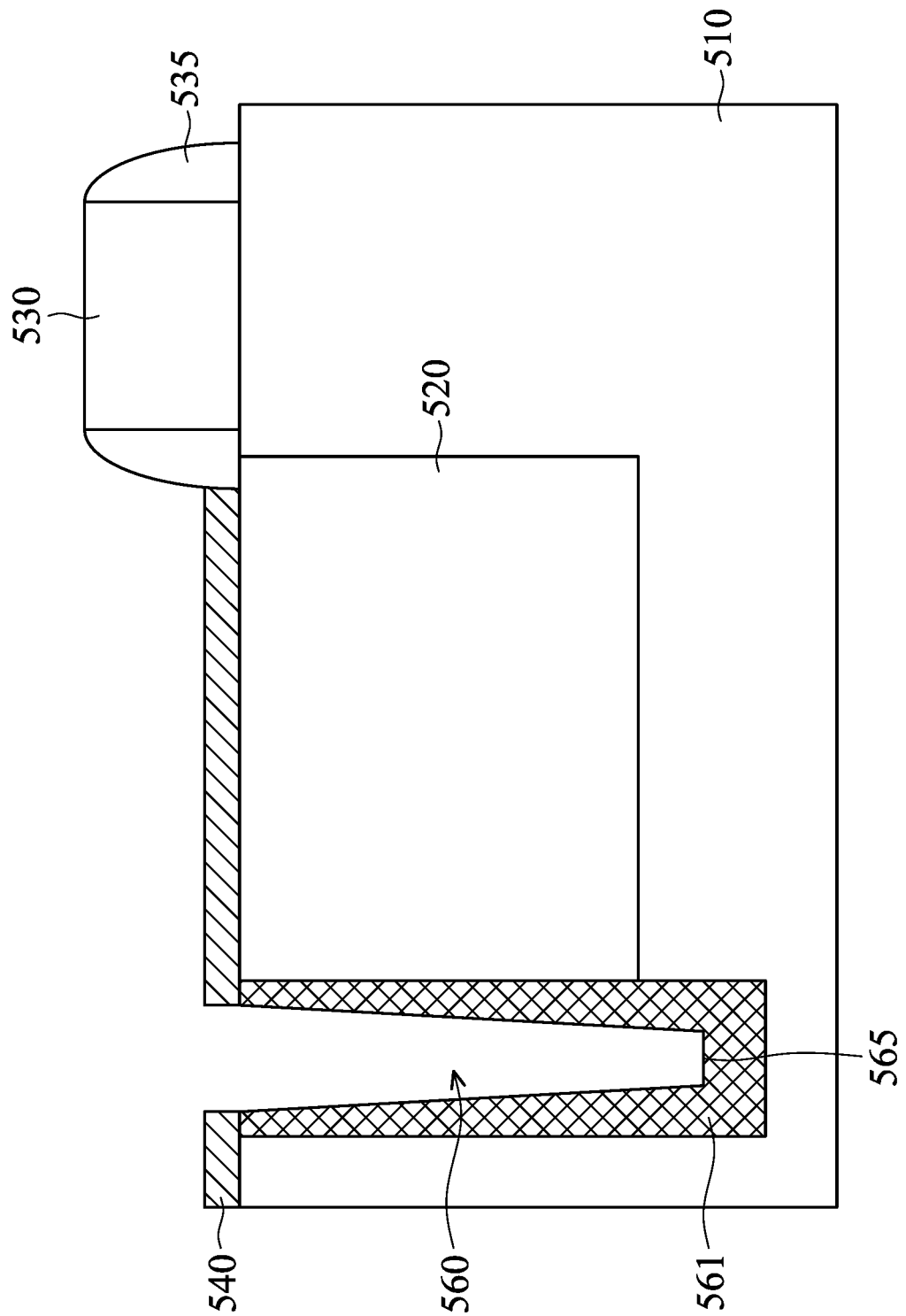
Figure 5J:
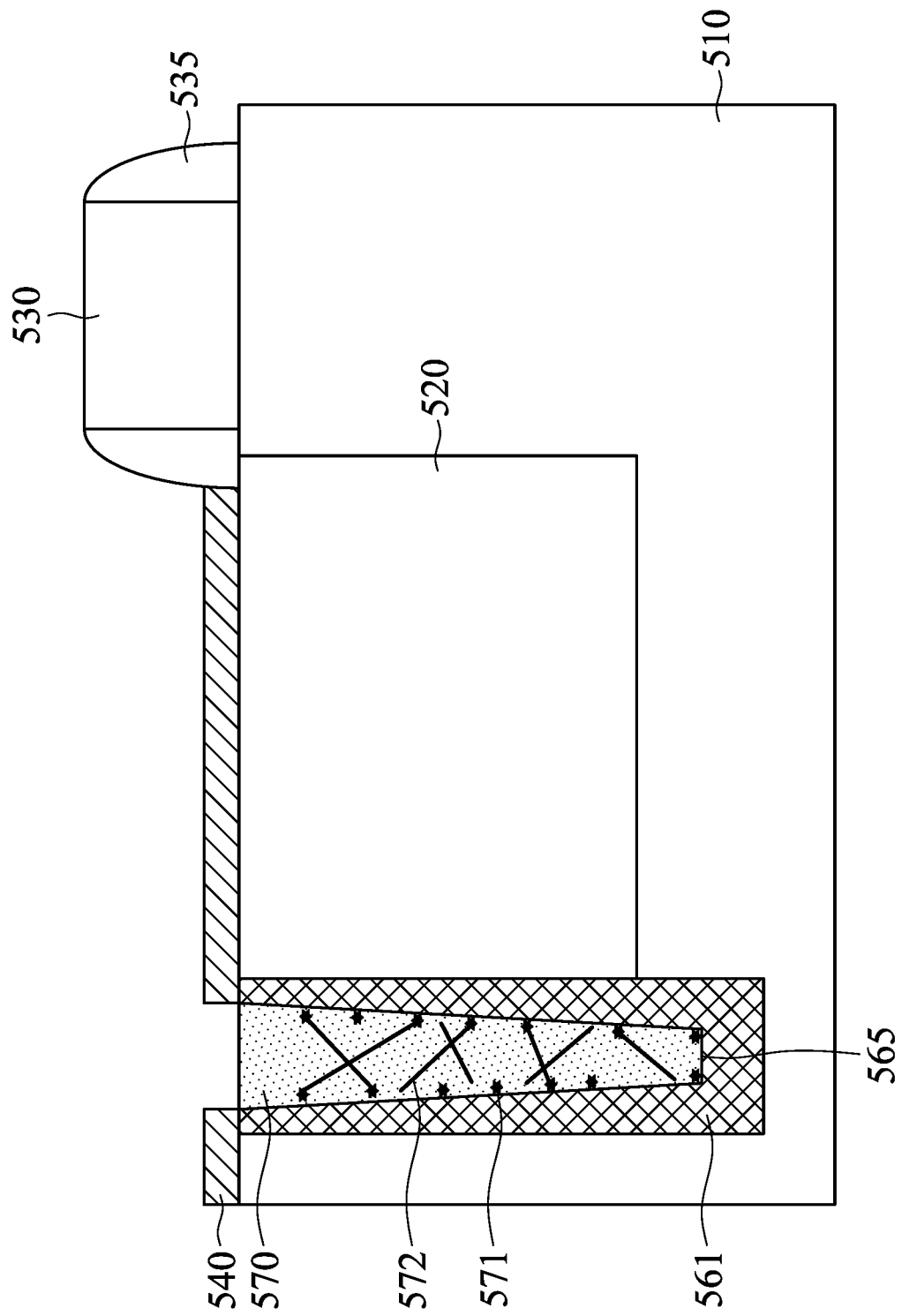

As shown in FIG. 5I, the patterned photoresist 550 is removed, e.g. by using an etching process, a polishing process or a thinning process. Then as shown in FIG. 5J, a heterogeneous layer 570 is formed in the trench 560 to fill the trench 560. In the example shown in FIG. 5J, the heterogeneous layer 570 is epitaxially grown on the bottom surface 565 of the trench 560. While the bottom surface 565 and the substrate 510 include a first semiconductor material, the heterogeneous layer 570 comprises a second semiconductor material that has a lattice constant different from that of the first semiconductor material. For example, when the first semiconductor material is silicon, the heterogeneous layer 570 may include a material with a larger lattice constant than silicon, e.g. Ge, SiGe, GeSn, InAs, or InSb; or include a material with a smaller lattice constant than silicon, e.g. SiC, SiB, or SiP. Due to the lattice mismatch between the first semiconductor material and the second semiconductor material, defects such as dislocations 571 and strains 572 are formed within the heterogeneous layer 570 and terminate at the hetero-interfaces between the heterogeneous layer 570 and the isolation region 561 in the substrate 510.

Figure 5K:
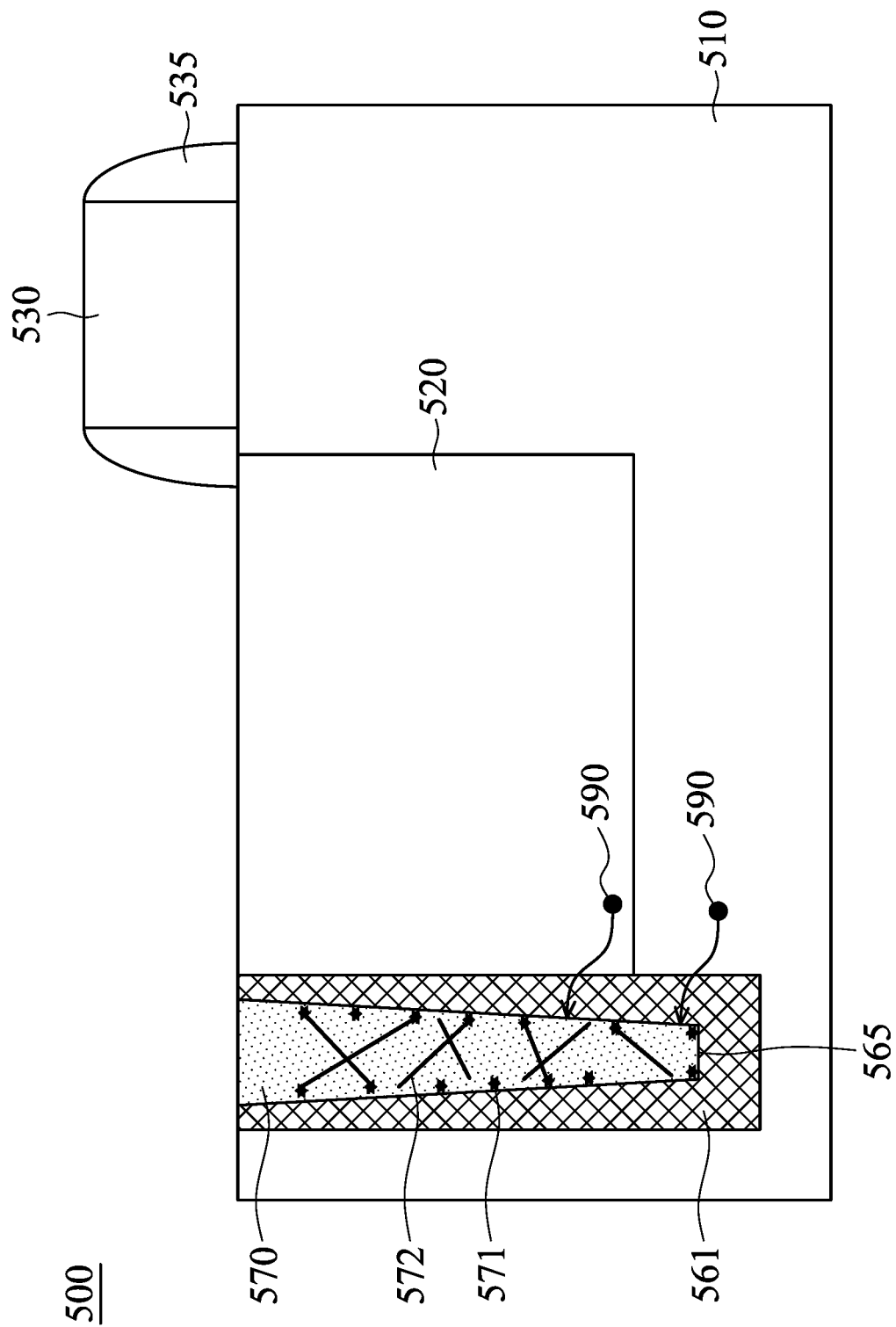

As shown in FIG. 5K, the hard mask 540 is removed, e.g. by using an etching process, a polishing process or a thinning process. This forms a semiconductor device 500. In some examples, the heterogeneous layer 570 can provide a gettering of impurities 590, e.g. metal ions, dot-defects, or other impurities, in the substrate 510 and in the pixel region 520. The isolation region 561 is configured for isolating the heterogeneous layer 570 from charge carriers generated in the substrate 510 based on, e.g. an incident light into the light sensing materials in the pixel region 520.

Figure 6:
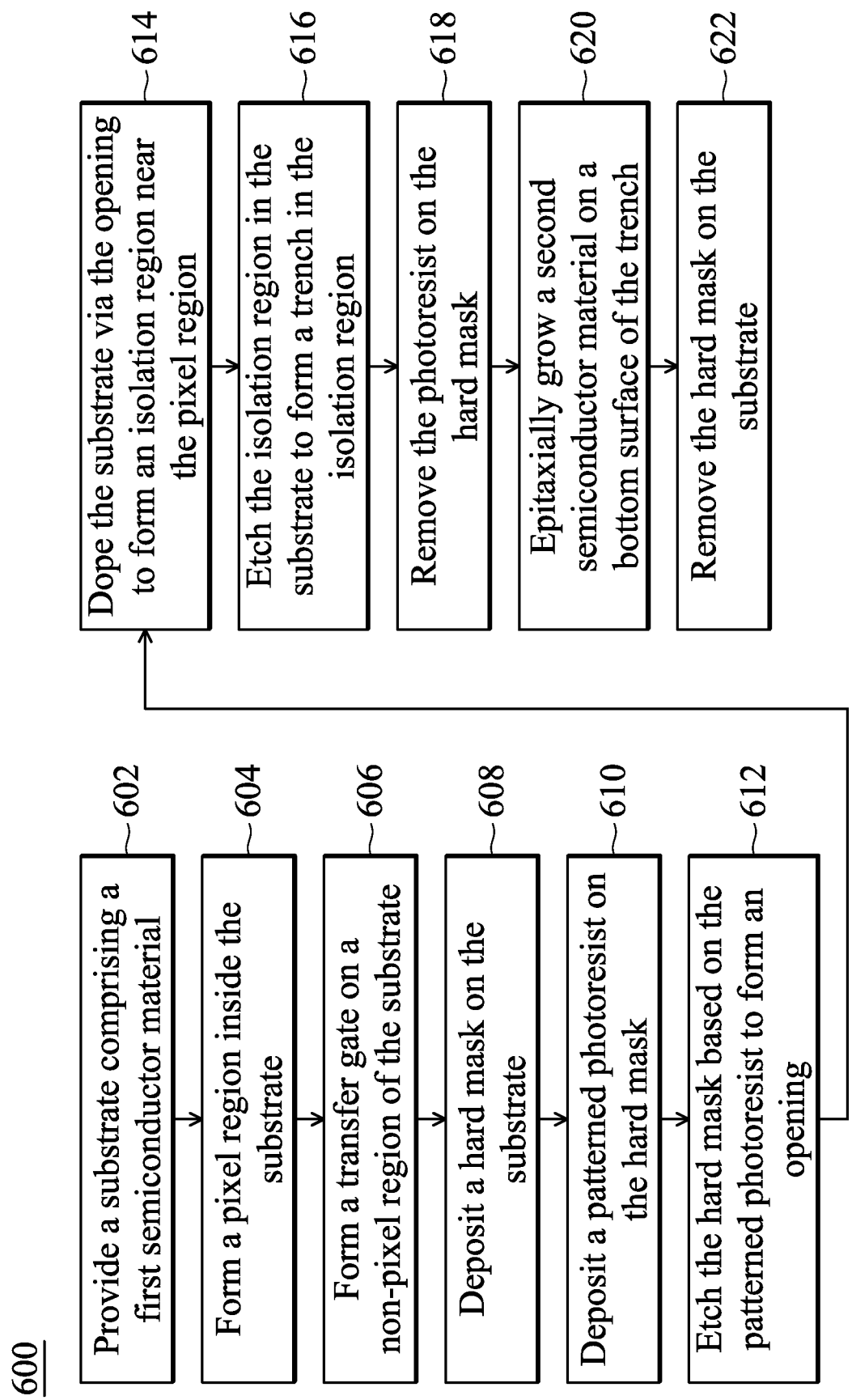
FIG. 6 illustrates a flow chart of another method for manufacturing a device comprising at least one pixel cell, in accordance with some embodiments of the present disclosure.

FIG. 6 illustrates a flow chart of another method 600 for manufacturing a device comprising at least one pixel cell, e.g. the semiconductor device 100 in FIG. 1, in accordance with some embodiments of the present disclosure. The method begins at operation 602, where a substrate comprising a first semiconductor material is provided. At operation 604, a pixel region is formed inside the substrate, where the remaining portion of the substrate other than the pixel region forms a non-pixel region.

At operation 606, a transfer gate is formed on the non-pixel region of the substrate. At operation 608, a hard mask is deposited on the substrate. At operation 610, a patterned photoresist is deposited on the hard mask. At operation 612, the hard mask is etched based on the patterned photoresist to form an opening of the hard mark on the substrate.

At operation 614, the substrate is doped via the opening to form an isolation region in the substrate near the pixel region. At operation 616, the isolation region in the substrate is etched to form a trench in the isolation region. At operation 618, the photoresist on the hard mask is removed. At operation 620, a second semiconductor material is epitaxially grown on a bottom surface of the trench to form a heterogeneous layer. At operation 622, the hard mask on the substrate is removed to form the device.

Figure 7:
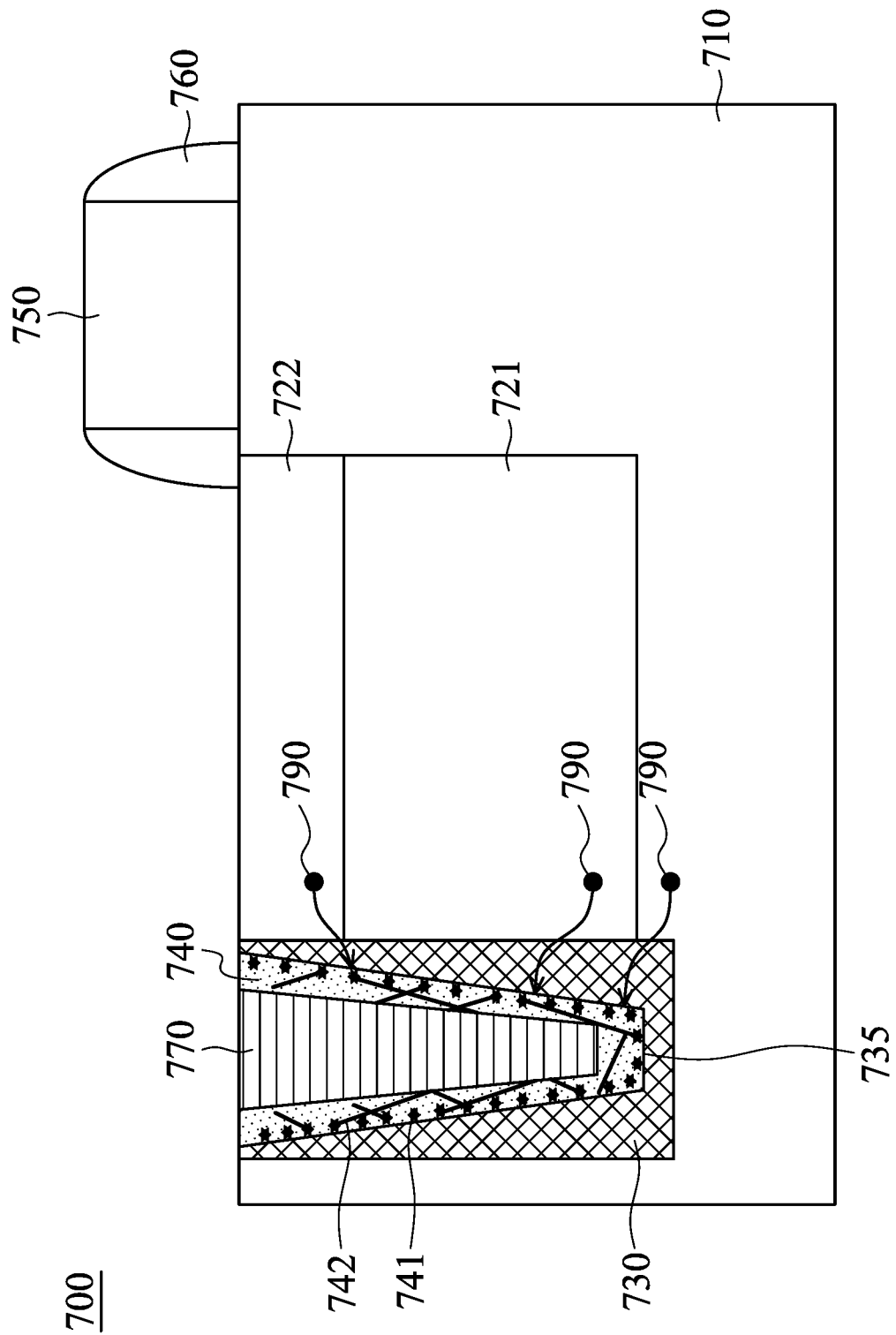
FIG. 7 illustrates a schematic cross-sectional view of another device comprising a pixel cell and a gettering center, in accordance with some embodiments of the present disclosure.

FIG. 7 illustrates a schematic cross-sectional view of another device 700 comprising a pixel cell and a gettering center, in accordance with some embodiments of the present disclosure. The device 700 includes a substrate 710 and a pixel region disposed in the substrate 710. The pixel region includes: a first light sensing region 721 disposed in the substrate 710, and a second light sensing region 722 disposed on the first light sensing region 721. In one embodiment, the first light sensing region 721 comprises a first dopant of a first conductivity type; and the second light sensing region 722 comprises a second dopant of a second conductivity type different from the first conductivity type. In one embodiment, the substrate 710 includes silicon; the first light sensing region 721 comprises n-type doped silicon to form an n-type photodiode sensor; and the second light sensing region 722 comprises p-type doped silicon to form a p-type photodiode sensor. In one embodiment, the first light sensing region 721 and the second light sensing region 722 form a p-n junction for transforming photons into electrons when the pixel region is exposed to light.

Similar to the device 100 in FIG. 1, the device 700 further includes a transfer gate 750 disposed on the non-pixel region of the substrate 710 and surrounded by a spacer 760. Similar to the device 100 in FIG. 1, the device 700 includes an isolation region 730 disposed in the substrate 710 and within a proximity of the pixel region comprising the first light sensing region 721 and the second light sensing region 722. In one embodiment, the isolation region 730 is in direct contact with the first light sensing region 721 and the second light sensing region 722.

As shown in FIG. 7, the device 700 has a heterogeneous layer 740 disposed in a trench that extends into the isolation region 730 and has a bottom surface 735. The bottom surface 735 of the trench serves as a seed area for epitaxially growing the heterogeneous layer 740 in the trench. The heterogeneous layer 740 is surrounded by the isolation region 730 as shown in FIG. 7. In one embodiment, the isolation region 730 comprises a same semiconductor material as the substrate 710, and comprises a dopant configured for isolating the heterogeneous layer 740 from charge carriers generated in the substrate 710. The dopant may have a conductivity type being n-type or p-type.

Different from the device 100 in FIG. 1, the device 700 in FIG. 7 includes a trench isolation 770 extending into the heterogeneous layer 740. In one embodiment, the trench isolation 770 is a shallow trench isolation (STI) structure formed according to a predetermined design. In one embodiment, the trench isolation 770 comprises a dielectric material, such as silicon oxide, silicon nitride, silicon oxynitride, silicon carbide, or any combinations thereof.

In some embodiments, while the substrate 710 includes a first semiconductor material, the heterogeneous layer 740 includes a second semiconductor material that has a lattice constant different from that of the first semiconductor material. As such, there is a lattice match between the first semiconductor material in the isolation region 730 and the second semiconductor material in the heterogeneous layer 740, which induces defects such as dislocations 741 and strains 742 at the hetero-interface, where the defects or strains can penetrate into the heterogeneous layer 740. The strains and defects induced by the heterogeneous layer 740 are effective for gettering of impurities 790, e.g. metal ions, dot-defects, or other impurities, in the substrate 710, the first light sensing region 721, and the second light sensing region 722. The strains, defects and dislocations originated within the heterogeneous layer 740 terminate at the hetero-interfaces between the heterogeneous layer 740 and the isolation region 730. That is, the strains, defects and dislocations are located within the heterogeneous layer 740, but not within the isolation region 730 or other portions of the substrate 710, which ensures that no defect will extend from the heterogeneous layer 740 into other portions of the substrate 710 to cause silicon damage.

Figure 8:
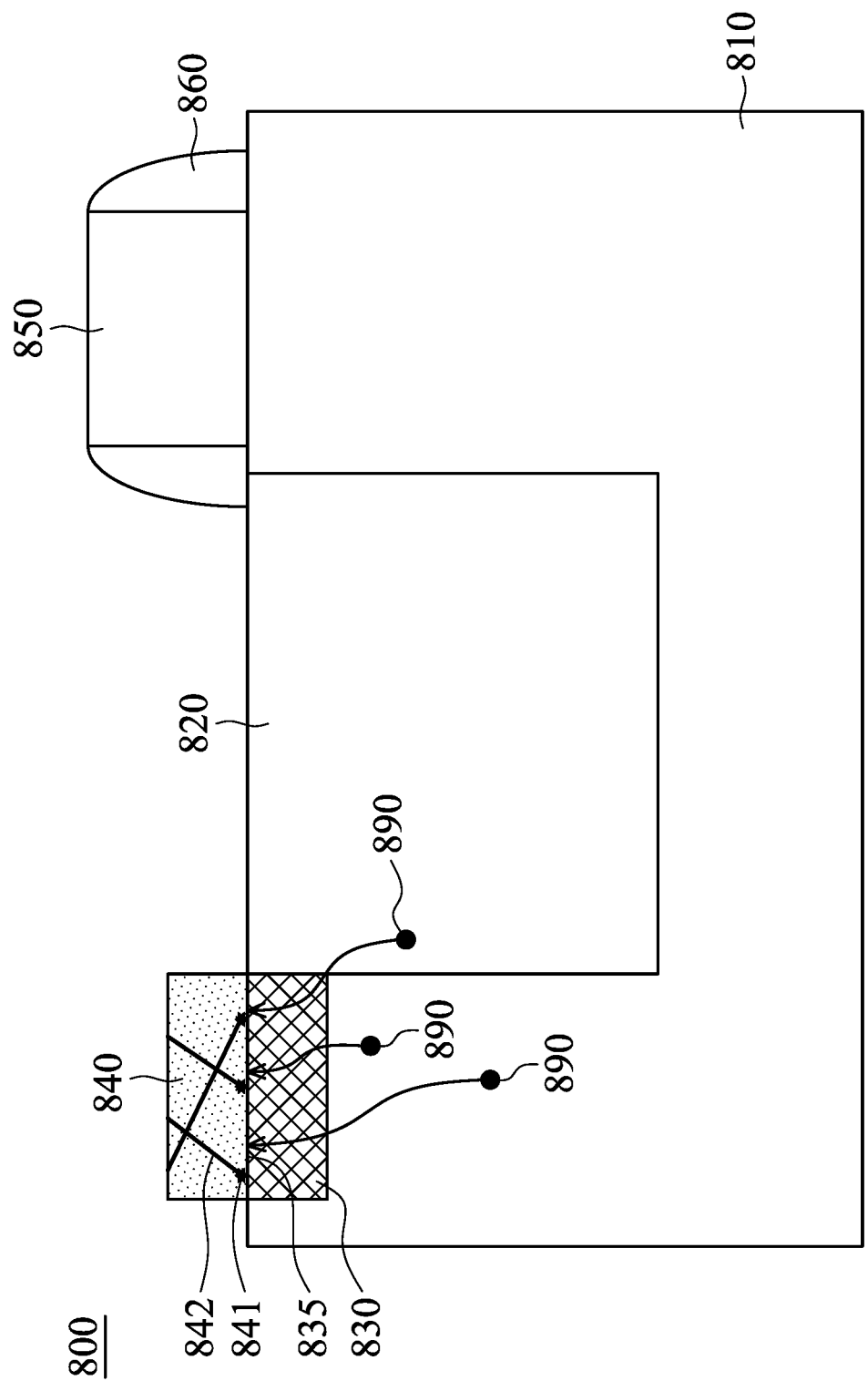
FIG. 8 illustrates a schematic cross-sectional view of yet another device comprising a pixel cell and a gettering center, in accordance with some embodiments of the present disclosure.

FIG. 8 illustrates a schematic cross-sectional view of yet another device 800 comprising a pixel cell and a gettering center, in accordance with some embodiments of the present disclosure. The device 800 in FIG. 8 has a similar structure to the device 100 in FIG. 1, except that the device 800 has a heterogeneous layer 840 disposed above a pixel region 820 and right above an isolation region 830. The pixel region 820 and the isolation region 830 are disposed in the substrate 810, and are located next to each other. In one embodiment, while the isolation region 830 includes silicon as the substrate 810, the heterogeneous layer 840 is epitaxially grown on a top surface 835 of the isolation region 830 and includes a material with a larger lattice constant than silicon, e.g. Ge, SiGe, GeSn, InAs, or InSb, or a material with a smaller lattice constant than silicon, e.g. SiC, SiB, or SiP. This lattice mismatch at the seed area 835 induces defects such as dislocations 841 and strains 842 within the heterogeneous layer 840, to provide a gettering of impurities 890, e.g. metal ions, dot-defects, or other impurities, in the substrate 810 and the pixel region 820. Because of the clear boundary between the heterogeneous layer 840 and the isolation region 830, the strains, defects and dislocations generated due to the lattice mismatch are located within the heterogeneous layer 840 only, and will not extend into the substrate 810 or the pixel region 820 to cause silicon damage.

Figure 9:
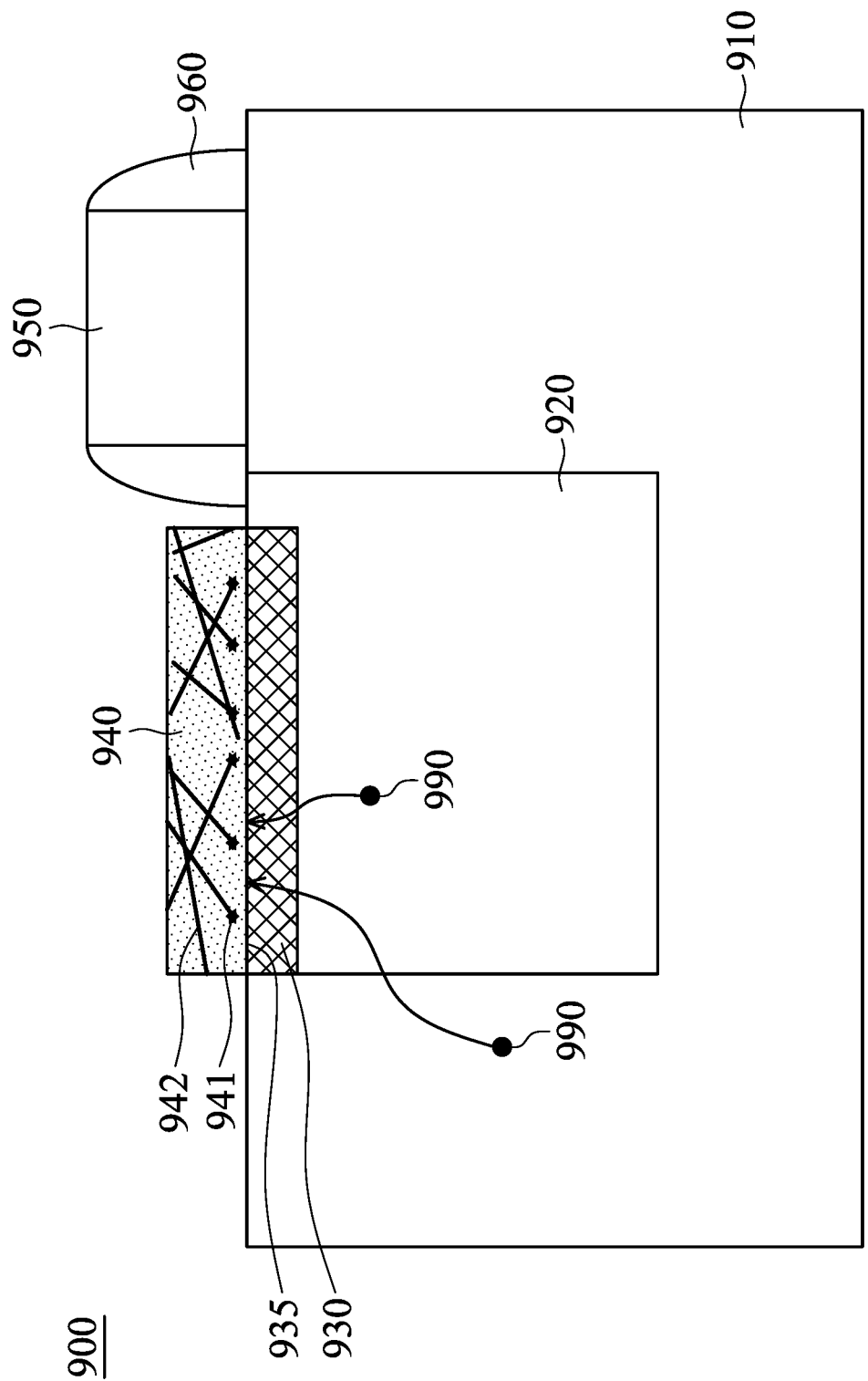
FIG. 9 illustrates a schematic cross-sectional view of still another device comprising a pixel cell and a gettering center, in accordance with some embodiments of the present disclosure.

FIG. 9 illustrates a schematic cross-sectional view of still another device 900 comprising a pixel cell and a gettering center, in accordance with some embodiments of the present disclosure. The device 900 in FIG. 9 has a similar structure to the device 800 in FIG. 8, except that the device 900 has an isolation region 930 on a pixel region 920 that is disposed in the substrate 910, and has a heterogeneous layer 940 on the isolation region 930. In one embodiment, while the isolation region 930 includes silicon as the substrate 910, the heterogeneous layer 940 is epitaxially grown on a top surface 935 of the isolation region 930 and includes a semiconductor material with a different lattice constant from silicon. This lattice mismatch at the seed area 935 induces defects such as dislocations 941 and strains 942 within the heterogeneous layer 940, to provide a gettering of impurities 990, e.g. metal ions, dot-defects, or other impurities, in the substrate 910 and the pixel region 920. Because of the clear boundary between the heterogeneous layer 940 and the isolation region 930, the strains, defects and dislocations generated due to the lattice mismatch are located within the heterogeneous layer 940 only, and will not extend into the substrate 910 or the pixel region 920 to cause silicon damage.

In some embodiments, a device is disclosed. The device includes: a substrate; a pixel region disposed in the substrate; an isolation region disposed in the substrate and within a proximity of the pixel region; and a heterogeneous layer on the seed area. The isolation region comprises a seed area including a first semiconductor material. The heterogeneous layer comprises a second semiconductor material that has a lattice constant different from that of the first semiconductor material.

In some embodiments, an image sensor comprising a plurality of pixel cells is disclosed. Each of the plurality of pixel cells includes: a substrate; a pixel region disposed in the substrate; an isolation region on the pixel region; and a heterogeneous layer on the isolation region. The isolation region comprises a first semiconductor material. The heterogeneous layer comprises a second semiconductor material. There is a lattice mismatch between the first semiconductor material and the second semiconductor material.

In some embodiments, a method for forming a device comprising at least one pixel cell is disclosed. The method includes: providing a substrate comprising a first semiconductor material; forming a pixel region inside the substrate; forming a trench extending into the substrate and within a proximity of the pixel region; and epitaxially growing a heterogeneous layer on a bottom surface of the trench. The heterogeneous layer comprises a second semiconductor material that has a lattice constant different from that of the first semiconductor material.

While various embodiments of the present disclosure have been described above, it should be understood that they have been presented by way of example only, and not by way of limitation. Likewise, the various diagrams may depict an example architectural or configuration, which are provided to enable persons of ordinary skill in the art to understand exemplary features and functions of the present disclosure. Such persons would understand, however, that the present disclosure is not restricted to the illustrated example architectures or configurations, but can be implemented using a variety of alternative architectures and configurations. Additionally, as would be understood by persons of ordinary skill in the art, one or more features of one embodiment can be combined with one or more features of another embodiment described herein. Thus, the breadth and scope of the present disclosure should not be limited by any of the above-described exemplary embodiments.

It is also understood that any reference to an element herein using a designation such as "first," "second," and so forth does not generally limit the quantity or order of those elements. Rather, these designations are used herein as a convenient means of distinguishing between two or more elements or instances of an element. Thus, a reference to first and second elements does not mean that only two elements can be employed, or that the first element must precede the second element in some manner.

Additionally, a person having ordinary skill in the art would understand that information and signals can be represented using any of a variety of different technologies and techniques. For example, data, instructions, commands, information, signals, bits and symbols, for example, which may be referenced in the above description can be represented by voltages, currents, electromagnetic waves, magnetic fields or particles, optical fields or particles, or any combination thereof.

A person of ordinary skill in the art would further appreciate that any of the various illustrative logical blocks, modules, processors, means, circuits, methods and functions described in connection with the aspects disclosed herein can be implemented by electronic hardware (e.g., a digital implementation, an analog implementation, or a combination of the two), firmware, various forms of program or design code incorporating instructions (which can be referred to herein, for convenience, as "software" or a "software module"), or any combination of these techniques.

To clearly illustrate this interchangeability of hardware, firmware and software, various illustrative components, blocks, modules, circuits, and steps have been described above generally in terms of their functionality. Whether such functionality is implemented as hardware, firmware or software, or a combination of these techniques, depends upon the particular application and design constraints imposed on the overall system. Skilled artisans can implement the described functionality in various ways for each particular application, but such implementation decisions do not cause a departure from the scope of the present disclosure. In accordance with various embodiments, a processor, device, component, circuit, structure, machine, module, etc. can be configured to perform one or more of the functions described herein. The term "configured to" or "configured for" as used herein with respect to a specified operation or function refers to a processor, device, component, circuit, structure, machine, module, signal, etc. that is physically constructed, programmed, arranged and/or formatted to perform the specified operation or function.

Furthermore, a person of ordinary skill in the art would understand that various illustrative logical blocks, modules, devices, components and circuits described herein can be implemented within or performed by an integrated circuit (IC) that can include a digital signal processor (DSP), an application specific integrated circuit (ASIC), a field programmable gate array (FPGA) or other programmable logic device, or any combination thereof. The logical blocks, modules, and circuits can further include antennas and/or transceivers to communicate with various components within the network or within the device. A processor programmed to perform the functions herein will become a specially programmed, or special-purpose processor, and can be implemented as a combination of computing devices, e.g., a combination of a DSP and a microprocessor, a plurality of microprocessors, one or more microprocessors in conjunction with a DSP core, or any other suitable configuration to perform the functions described herein.

If implemented in software, the functions can be stored as one or more instructions or code on a computer-readable medium. Thus, the steps of a method or algorithm disclosed herein can be implemented as software stored on a computer-readable medium. Computer-readable media includes both computer storage media and communication media including any medium that can be enabled to transfer a computer program or code from one place to another. A storage media can be any available media that can be accessed by a computer. By way of example, and not limitation, such computer-readable media can include RAM, ROM, EEPROM, CD-ROM or other optical disk storage, magnetic disk storage or other magnetic storage devices, or any other medium that can be used to store desired program code in the form of instructions or data structures and that can be accessed by a computer.

In this document, the term "module" as used herein, refers to software, firmware, hardware, and any combination of these elements for performing the associated functions described herein. Additionally, for purpose of discussion, the various modules are described as discrete modules; however, as would be apparent to one of ordinary skill in the art, two or more modules may be combined to form a single module that performs the associated functions according embodiments of the present disclosure.

Various modifications to the implementations described in this disclosure will be readily apparent to those skilled in the art, and the general principles defined herein can be applied to other implementations without departing from the scope of this disclosure. Thus, the disclosure is not intended to be limited to the implementations shown herein, but is to be accorded the widest scope consistent with the novel features and principles disclosed herein, as recited in the claims below.

What is claimed is:

1. A device, comprising:
a substrate formed of a first semiconductor material;
a pixel region disposed in the substrate;
an isolation region disposed in the substrate and in direct contact with the pixel region, wherein the isolation region comprises a seed area and is formed by doping a portion of the substrate with a dopant, wherein the seed area is located on an inner bottom surface of the isolation region, wherein the inner bottom surface of the isolation region is lower than a bottom surface of the pixel region;
a trench structure extending into the isolation region, wherein the trench structure is on the seed area and not in contact with the pixel region; and
a heterogeneous layer on the seed area, wherein the heterogeneous layer comprises a second semiconductor material that has a lattice constant different from that of the first semiconductor material, wherein the second semiconductor material fully fills the trench structure.

2. The device of claim 1, wherein:
strains, defects and dislocations originate within the heterogeneous layer and terminate at hetero-interfaces between the heterogeneous layer and the isolation region.

3. The device of claim 2, wherein:
the strains, defects and dislocations are located in proximity to the hetero-interfaces.

4. The device of claim 1, wherein the heterogeneous layer provides a gettering of at least one of metal ions, dot-defects, or impurities in the substrate.

5. The device of claim 1, wherein:
the heterogeneous layer has a depth greater than that of the pixel region.

6. The device of claim 1, wherein:
the isolation region is configured for isolating the heterogeneous layer from charge carriers generated in the substrate;
the dopant has a conductivity type being n-type or p-type.

7. The device of claim 1, wherein:
the heterogeneous layer is disposed beside the pixel region.

8. The device of claim 1, wherein the pixel region comprises:
a first light sensing region disposed in the substrate and comprising a first dopant of a first conductivity type; and
a second light sensing region disposed on the first light sensing region and comprising a second dopant of a second conductivity type.

9. An image sensor comprising a plurality of pixel cells, wherein each of the plurality of pixel cells comprises:
a substrate formed of a first semiconductor material;
a pixel region disposed in the substrate;
an isolation region on a side of the pixel region, wherein the isolation region is formed by doping a portion of the substrate with a dopant, wherein the isolation region comprises a seed area located on an inner bottom surface of the isolation region, wherein the inner bottom surface of the isolation region is lower than a bottom surface of the pixel region;
a trench structure extending into the isolation region, wherein the trench structure is on the seed area, and wherein the trench structure is not in contact with the pixel region; and
a heterogeneous layer in the isolation region, wherein the heterogeneous layer comprises a second semiconductor material, and there is a lattice mismatch between the first semiconductor material and the second semiconductor material, wherein the second semiconductor material fully fills the trench structure.

10. The image sensor of claim 9, wherein a distance between the heterogeneous layer and the pixel region is less than one micrometer.

11. The image sensor of claim 9, wherein:
strains, defects and dislocations are located within the heterogeneous layer, but not within the isolation region.

12. The image sensor of claim 9, wherein:
the heterogeneous layer provides a gettering of at least one of metal ions, dot-defects, or impurities from the pixel region.

13. The image sensor of claim 9, wherein:
the isolation region is configured for isolating the heterogeneous layer from charge carriers generated in the substrate; and
the dopant has a conductivity type being n-type or p-type.

14. A device, comprising:
a substrate formed of a first semiconductor material;
a pixel region disposed in the substrate, wherein the remaining portion of the substrate other than the pixel region forms a non-pixel region;
an isolation region disposed in the non-pixel region of the substrate and within a proximity of the pixel region, wherein the isolation region comprises a seed area and is formed by doping a portion of the substrate with a dopant, wherein the seed area is located on an inner bottom surface of the isolation region, wherein the inner bottom surface of the isolation region is lower than a bottom surface of the pixel region; and
a heterogeneous layer on the seed area in the isolation region, wherein the heterogeneous layer has a depth greater than that of the pixel region, wherein the heterogeneous layer comprises a second semiconductor material that has a lattice constant different from that of the first semiconductor material, wherein the second semiconductor material fully fills a trench structure extending into the isolation region, wherein the trench structure is on the seed area, and wherein the trench structure is not in contact with the pixel region.

15. The device of claim 14, wherein:
strains, defects and dislocations originate within the heterogeneous layer and terminate at hetero-interfaces between the heterogeneous layer and the isolation region.

16. The device of claim 15, wherein:
the strains, defects and dislocations are located in proximity to the hetero-interfaces.

17. The device of claim 14, wherein the heterogeneous layer provides a gettering of at least one of metal ions, dot-defects, or impurities in the substrate.

18. The device of claim 14, wherein:
the isolation region is configured for isolating the heterogeneous layer from charge carriers generated in the substrate;
the dopant has a conductivity type being n-type or p-type.

19. The device of claim 14, wherein the pixel region comprises:
- a first light sensing region disposed in the substrate and comprising a first dopant of a first conductivity type; and
- a second light sensing region disposed on the first light sensing region and comprising a second dopant of a second conductivity type.

* * * * *